(12) United States Patent
Nishitani et al.

(10) Patent No.: US 11,420,330 B2
(45) Date of Patent: *Aug. 23, 2022

(54) ROBOT CONTROL DEVICE, ROBOT, AND SIMULATION DEVICE

(71) Applicant: Seiko Epson Corporation, Tokyo (JP)

(72) Inventors: Masanobu Nishitani, Suwa (JP); Tsutomu Hagihara, Hara (JP); Norio Yokoshima, Torrance, CA (US); Kazuhiro Masuda, Matsumoto (JP)

(73) Assignee: Seiko Epson Corporation

( * ) Notice: Subject to any disclaimer, the term of this patent is extended or adjusted under 35 U.S.C. 154(b) by 232 days.

This patent is subject to a terminal disclaimer.

(21) Appl. No.: 16/449,842

(22) Filed: Jun. 24, 2019

(65) Prior Publication Data

US 2019/0308322 A1 Oct. 10, 2019

Related U.S. Application Data

(63) Continuation of application No. 15/467,176, filed on Mar. 23, 2017, now Pat. No. 10,384,347.

(30) Foreign Application Priority Data

Mar. 25, 2016 (JP) .................. 2016-062201
Mar. 30, 2016 (JP) .................. 2016-068260

(51) Int. Cl.
*B25J 9/16* (2006.01)
*G06F 30/20* (2020.01)

(52) U.S. Cl.
CPC ......... *B25J 9/1671* (2013.01); *B25J 9/1666* (2013.01); *G06F 30/20* (2020.01); *G05B 2219/40315* (2013.01); *G05B 2219/40317* (2013.01); *Y10S 901/02* (2013.01)

(58) Field of Classification Search
CPC ...... B25J 9/1671; B25J 9/1666; B25J 9/1676; G05B 2219/40315; G05B 2219/40317; Y10S 901/02
See application file for complete search history.

(56) References Cited

U.S. PATENT DOCUMENTS 4,513,366 A 4/1985 Munekata et al.
5,239,248 A 8/1993 Shimada et al.
(Continued)

FOREIGN PATENT DOCUMENTS

JP S58-163001 A 9/1983
JP H02-300902 A 12/1990
(Continued)

OTHER PUBLICATIONS

Bernhardt et al., "The Realistic Robot Simulation (RRS) Interface", 1994, Fraunhofer-Institute for Production Systems and Design Technology, pp. 321-324 (Year: 1994).*

*Primary Examiner* — Spencer D Patton
(74) *Attorney, Agent, or Firm* — Harness, Dickey & Pierce, P.L.C.

(57) ABSTRACT

A robot control device according to an aspect of the invention is a robot control device that controls a robot on the basis of a simulation result of a simulation device that performs a simulation of operation of a virtual robot on a virtual space. In the simulation, a first region and a second region located on an inside of the first region can be set on the virtual space. In the case where the virtual robot operates, when a specific portion of the virtual robot intrudes into the first region, operating speed of the virtual robot is limited. When the specific portion of the virtual robot intrudes into the second region, the operation of the virtual robot stops or the virtual robot retracts from the second region.

5 Claims, 17 Drawing Sheets

(56) References Cited

U.S. PATENT DOCUMENTS

| | | | |
|---|---|---|---|
| 6,031,973 | A | 2/2000 | Gomi et al. |
| 7,664,570 | B2 | 2/2010 | Suita et al. |
| 8,812,159 | B2 | 8/2014 | Maehara et al. |
| 10,384,347 | B2 * | 8/2019 | Nishitani ............... B25J 9/1666 |
| 2004/0128026 | A1 * | 7/2004 | Harris .................... A61B 34/76 |
| | | | 700/245 |
| 2004/0249508 | A1 | 12/2004 | Suita et al. |
| 2005/0055134 | A1 | 3/2005 | Okuda et al. |
| 2008/0243306 | A1 * | 10/2008 | Koike ................. B23K 9/1272 |
| | | | 700/250 |
| 2012/0166165 | A1 | 6/2012 | Nogami et al. |
| 2017/0128136 | A1 | 5/2017 | Post |

FOREIGN PATENT DOCUMENTS

| | | |
|---|---|---|
| JP | H11-254360 A | 9/1999 |
| JP | 2004-280635 A | 10/2004 |
| JP | 2004-322244 A | 11/2004 |
| JP | 2005-081445 A | 3/2005 |
| JP | 2006-058930 A | 3/2006 |
| JP | 2006-215750 A | 8/2006 |
| JP | 3832517 B2 | 10/2006 |
| JP | 2008-213056 A | 9/2008 |
| JP | 2009-090400 A | 4/2009 |
| JP | 2009-226561 A | 10/2009 |
| JP | 2010-042466 A | 2/2010 |
| JP | 2010-208002 A | 9/2010 |
| JP | 2011-212831 A | 10/2011 |
| JP | 2012-135821 A | 7/2012 |
| JP | 2014-217901 A | 11/2014 |

\* cited by examiner

ROBOT CONTROL DEVICE, ROBOT, AND SIMULATION DEVICE

CROSS-REFERENCE TO RELATED APPLICATIONS

This is a continuation patent application of U.S. application Ser. No. 15/467,176, filed Mar. 23, 2017, which claims priority to Japanese Patent Application No. 2016-066201, filed Mar. 25, 2016, and Japanese Patent Application No. 2016-068260, filed Mar. 30, 2016 all of which are incorporated by reference herein in their entireties.

BACKGROUND

1. Technical Field

The present invention relates to a robot control device, a robot, and a simulation device.

2. Related Art

Researches and developments of a technique for virtually simulating the operation of a robot control device that controls a robot have been performed.

Concerning the technique, there has been known a robot simulation device that moves a virtual robot along a track, the robot simulation device performing, at an interrupt interval, a track calculation process for calculating a track after a sampling time of the virtual robot and individually changing both of the sampling time and the interrupt interval in a range in which the sampling time is equal to or shorter than the interrupt interval (see, for example, JP-A-2012-135821 (Patent Literature 1)).

There has been known a robot including a base and a manipulator including a plurality of arms (links). One arm of two arms adjacent to each other of the manipulator is turnably coupled to the other arm via a joint section. An arm on the most proximal end side (on the most upstream side) is turnably coupled to the base via a joint section. The joint sections are driven by motors. The arms turn according to the driving of the joint sections. For example, a hand is detachably attached to an arm on the most distal end side (on the most downstream side) as an end effector. For example, the robot grips a target object with the hand, moves the target object to a predetermined place, and performs predetermined work such as assembly.

As a robot control device that controls the operation of such a robot, there has been disclosed a device that defines a virtual safety fence set on the inner side of a real safety fence and two or more three-dimensional space regions set to include a wrist of the robot and, work, a tool, or the like included in the wrist and controls the robot (see, for example, JP-A-2004-322244 (Patent Literature 2)).

The robot control device collates predicted positions on track calculation in the three-dimensional space regions and the virtual safety fence and, when any one of the three-dimensional space regions intrudes into the virtual safety fence, stops the operation of the robot. Consequently, it is possible to suppress collision of the robot and the real safety fence.

However, in the robot simulation device described in Patent Literature 1, the interrupt interval sometimes changes according to other interrupt processing. As a result, a shift sometimes occurs between time when the robot simulation device causes the robot to perform predetermined work and time when a real robot control device causes a real robot to perform the work.

In the robot control device described in Patent Literature 2, even if stop operation of the robot is started when the three-dimensional space region intrudes into the virtual space fence, for example, when the operating speed of the robot is high, it is likely that the robot cannot instantaneously stop and collides with the safety fence.

SUMMARY

An advantage of some aspects of the invention is to solve at least a part of the problems described above, and the invention can be implemented as the following forms or application examples.

A robot control device according to an aspect of the invention is a robot control device that controls a robot on the basis of a simulation result of a simulation device that performs a simulation of operation of a virtual robot on a virtual space. In the simulation, a first region and a second region located on an inside of the first region can be set on the virtual space. In the case where the virtual robot operates, when a specific portion of the virtual robot intrudes into the first region, operating speed of the virtual robot is limited. When the specific portion of the virtual robot intrudes into the second region, the operation of the virtual robot stops or the virtual robot retracts from the second region.

With this configuration, for example, when the first region and the second region are set to surround a virtual object with which the robot is desired to not be caused to collide and the simulation is performed, it is possible to operate the robot without causing the robot to collide with an object with which the robot is desired to not be caused to collide such as a peripheral device. Therefore, safety is high.

In the robot control device according to the aspect of the invention, it is preferable that, in the simulation, the first region and the second region surround a predetermined object on the virtual space.

With this configuration, for example, when the predetermined object is set as a virtual object with which the predetermined object is desired to not be caused to collide and the simulation is performed, it is possible to suppress the virtual robot from colliding with the virtual object with which the virtual robot is desired to not be caused to collide such as a virtual peripheral device. Therefore, it is possible to operate the robot without causing the robot to collide with an object with which the robot is desired to not be caused to collide.

In the robot control device according to the aspect of the invention, it is preferable that, in the simulation, the first region and the second region can be set on the basis of a coordinate system different from a world coordinate system.

With this configuration, it is possible to set coordinate axes in any directions. Therefore, convenience is high. Therefore, it is possible to easily provide a high-performance robot control device.

In the robot control device according to the aspect of the invention, it is preferable that, in the simulation, a predetermined object on the virtual space can be semi-transparently displayed.

With this configuration, it is possible to easily visually recognize the inside of the virtual object. It is possible to easily perform the simulation. Therefore, it is possible to easily provide a high-performance robot control device.

In the robot control device according to the aspect of the invention, it is preferable that, in the simulation, transparency of the semi-transparently displayed object can be set.

With this configuration, it is possible to adjust a balance of visibility of the contour and visibility of the inside of the virtual object. It is possible to easily perform the simulation. Therefore, it is possible to easily provide a high-performance robot control device.

In the robot control device according to the aspect of the invention, it is preferable that, in the simulation, when the predetermined object on the virtual space and the virtual robot come into contact with each other, a first mark different from the object and the virtual robot is displayed in a contact portion of the object and the virtual robot.

With this configuration, it is possible to easily grasp a contact portion of the virtual object and the virtual robot. Therefore, it is possible to easily perform setting of a moving route of the virtual robot, disposition of a virtual peripheral device, and the like. Therefore, it is possible to easily provide a high-performance robot control device.

In the robot control device according to the aspect of the invention, it is preferable that, in the simulation, a semi-transparent second mark surrounding the first mark is displayed.

With this configuration, it is possible to more easily grasp the contact portion of the virtual object and the virtual robot. Therefore, it is possible to easily provide a high-performance robot control device.

In the robot control device according to the aspect of the invention, it is preferable that, in the simulation, a coordinate of the contact portion is displayed.

With this configuration, it is possible to quantitatively, easily, and accurately grasp a position of a contact portion of the virtual object and the virtual robot. Therefore, it is possible to easily provide a high-performance robot control device.

In the robot control device according to the aspect of the invention, it is preferable that, in the simulation, a first margin can be set in the virtual robot on the basis of a shape of the virtual robot, a second margin can be set in the object on the basis of a shape of the predetermined object on the virtual space, and, when the virtual robot operates, if the first margin and the second margin come into contact with each other, operating speed of the virtual robot is limited, operation of the virtual robot stops, or the virtual robot retracts in a direction in which the first margin separates from the second margin.

With this configuration, for example, when the second margin is set in a virtual object with which the robot is desired to not be caused to collide and the simulation is performed, it is possible to suppress the virtual robot from colliding with the virtual object with which the virtual robot is desired to not be caused to collide such as a virtual peripheral device or another virtual robot. Therefore, it is possible to operate the robot without causing the robot to collide with an object with which the robot is desired to not be caused to collide such as a peripheral device or another robot.

In the robot control device according to the aspect of the invention, it is preferable that, in the simulation, thickness of the first margin and thickness of the second margin can be changed.

With this configuration, for example, when the first region and the second region are set to surround a virtual object with which the robot is desired to not be caused to collide and the simulation is performed, it is possible to suppress the virtual robot from colliding with the virtual object with which the virtual robot is desired to not be caused to collide such as a virtual peripheral device. It is possible to suppress the thickness of the first margin or the second margin from becoming excessively large to hinder work of the virtual robot. Therefore, it is possible to operate the robot without causing the robot to collide with an object with which the robot is desired to not be caused to collide such as a peripheral device. It is possible to suppress the thickness of the first margin or the second margin from becoming excessively large to hinder work of the robot.

In the robot control device according to the aspect of the invention, it is preferable that the virtual robot includes a virtual manipulator, and, in the simulation, a movable range of a specific portion of the virtual manipulator can be displayed.

With this configuration, it is possible to easily grasp the movable range of the specific portion of the virtual manipulator. Therefore, it is possible to easily provide a high-performance robot control device.

In the robot control device according to the aspect of the invention, it is preferable that the virtual manipulator includes a plurality of virtual arms provided to be capable of turning, and, in the simulation, for each of the virtual arms, a movable range of the specific portion of the virtual manipulator at the time when the virtual arm is turned can be displayed.

With this configuration, it is possible to easily grasp, for each of the virtual arms, the movable range of the specific portion of the virtual manipulator at the time when the virtual arm is turned. Therefore, it is possible to easily provide a high-performance robot control device.

In the robot control device according to the aspect of the invention, it is preferable that the specific portion of the virtual manipulator is a distal end of the virtual manipulator.

With this configuration, it is possible to easily grasp the movable range of the distal end of the virtual manipulator. Therefore, it is possible to easily provide a high-performance robot control device.

A robot according to an aspect of the invention is controlled by the robot control device according to the aspect of the invention.

With this configuration, it is possible to suppress the robot from colliding with an object with which the robot is desired to not be caused to collide such as a peripheral device. It is possible to provide the robot having the advantage of the robot control device according to the aspect of the invention that, for example, safety is high.

A simulation device according to an aspect of the invention is a simulation device that performs a simulation of operation of a virtual robot on a virtual space. In the simulation, a first region and a second region located on an inside of the first region can be set on the virtual space. In the case where the virtual robot operates, when a specific portion of the virtual robot intrudes into the first region, operating speed of the virtual robot is limited. When the specific portion of the virtual robot intrudes into the second region, the operation of the virtual robot stops or the virtual robot retracts from the second region.

With this configuration, in the simulation of the operation of the virtual robot on the virtual space, for example, when the first region and the second region are set to surround a virtual object with which the robot is desired to not be caused to collide, it is possible to suppress the virtual robot from colliding with a virtual object with which the virtual robot is desired to not be caused to collide such as a virtual peripheral device.

An aspect of the invention is directed to a robot control device that controls a robot on the basis of a simulation result of a simulation device that perform a simulation of operation of a virtual robot control device on a virtual space. In the simulation performed by the simulation device, a difference between time when the virtual robot control device performs predetermined first operation and time when the robot control device corresponding to the virtual robot control device performs second operation corresponding to the first operation is shorter than 1 millisecond.

With this configuration, the robot control device controls the robot on the basis of the simulation result of the simulation device that performs the simulation in which the difference between the time when the virtual robot control device performs the predetermined first operation and the time when the robot control device corresponding to the virtual robot control device performs the second operation corresponding to the first operation is shorter than 1 millisecond. Consequently, the robot control device can suppress a shift between timing when the virtual robot control device performs the first operation and timing when the robot control device performs the second operation.

In another aspect of the invention, the robot control device may be configured such that the first operation is acquisition of information from a peripheral device connected to the simulation device, and the second operation is acquisition of the information from the peripheral device connected to the robot control device.

With this configuration, the robot control device controls the robot on the basis of a simulation result of the simulation device that performs a simulation in which a difference between time when the virtual robot control device performs the acquisition of the information from the peripheral device connected to the simulation device as the first operation and time when the robot control device performs the acquisition of the information from the peripheral device connected to the robot control device as the second operation corresponding to the first operation is shorter than 1 millisecond. Consequently, the robot control device can suppress a shift between the time when the robot control device performs the acquisition of the information from the peripheral device connected to the robot control device and the time when the virtual robot control device performs the acquisition of the information from the peripheral device connected to the simulation device.

In another aspect of the invention, the robot control device may be configured such that the virtual robot control device controls a virtual robot on the basis of the information from the peripheral device acquired by the first operation.

With this configuration, the robot control device controls the robot on the basis of a simulation result of the simulation device that performs a simulation in which the virtual robot control device controls the virtual robot on the basis of the information from the peripheral device acquired by the first operation. Consequently, the robot control device can suppress a shift between the time when the robot control device controls the robot on the basis of the information from the peripheral device acquired by the second operation and the time when the virtual robot control device controls the virtual robot on the basis of the information from the peripheral device acquired by the first operation.

In another aspect of the invention, the robot control device may be configured such that the first operation is an output of information to a peripheral device connected to the simulation device, and the second operation is an output of the information to the peripheral device connected to the robot control device.

With this configuration, the robot control device controls the robot on the basis of a simulation result of the simulation device that performs a simulation in which a difference between time when the virtual robot control device performs the output of the information to the peripheral device connected to the simulation device as the first operation and time when the robot control device performs the output of the information to the peripheral device connected to the robot control device as the second operation corresponding to the first operation is shorter than 1 millisecond. Consequently, the robot control device can suppress a shift between the time when the robot control device performs the output of the information to the peripheral device connected to the robot control device and the time when the virtual robot control device performs the output of the information to the peripheral device connected to the simulation device.

In another aspect of the invention, the robot control device may be configured such that the simulation device clocks an elapsed time on the basis of a quotient and a remainder obtained when a number based on an acquired clock number is divided by a predetermined clock number associated with a predetermined time.

With this configuration, the robot control device controls the robot on the basis of a simulation result of the simulation device that clocks the elapsed time on the basis of the quotient and the remainder obtained when the number based on the acquired clock number is divided by the predetermined clock number associated with the predetermined time. Consequently, the robot control device can suppress a shift between an elapsed time clocked by the robot control device and the elapsed time clocked by the simulation device.

In another aspect of the invention, the robot control device may be configured such that the number based on the clock number is a difference between the clock number acquired in last processing and the clock number acquired in present processing.

With this configuration, the robot control device controls the robot on the basis of a simulation result of the simulation device that clocks the elapsed time on the basis of the quotient and the remainder obtained when the difference between the clock number acquired in the last processing and the clock number acquired in the present processing is divided by the predetermined clock number associated with the predetermined time. Consequently, the robot control device can suppress, on the basis of the difference between the clock number acquired in the last processing and the clock number acquired in the present processing, a shift between an elapsed time clocked by the robot control device and the elapsed time clocked by the simulation device.

In another aspect of the invention, the robot control device may be configured such that the predetermined time is equal to or shorter than 1 millisecond.

With this configuration, the robot control device controls the robot on the basis of a simulation result of the simulation device that clocks the elapsed time on the basis of the quotient and the remainder obtained when the difference between the clock number acquired in the last processing and the clock number acquired in the present processing is divided by the predetermined clock number associated with the time equal to or shorter than 1 millisecond. Consequently, the robot control device can suppress a shift between an elapsed time clocked by the robot control device and the elapsed time clocked by the simulation device to be shorter than 1 millisecond.

In another aspect of the invention, the robot control device may be configured such that the predetermined time is equal to or shorter than 0.5 millisecond.

With this configuration, the robot control device controls the robot on the basis of a simulation result of the simulation device that clocks the elapsed time on the basis of the quotient and the remainder obtained when the difference between the clock number acquired in the last processing and the clock number acquired in the present processing is divided by the predetermined clock number associated with the time equal to or shorter than 0.5 millisecond. Consequently, the robot control device can suppress a shift between an elapsed time clocked by the robot control device and the elapsed time clocked by the simulation device to be shorter than 0.5 millisecond.

In another aspect of the invention, the robot control device may be configured such that the predetermined time is equal to or shorter than 0.1 millisecond.

With this configuration, the robot control device controls the robot on the basis of a simulation result of the simulation device that clocks the elapsed time on the basis of the quotient and the remainder obtained when the difference between the clock number acquired in the last processing and the clock number acquired in the present processing is divided by the predetermined clock number associated with the time equal to or shorter than 0.1 millisecond. Consequently, the robot control device can suppress a shift between an elapsed time clocked by the robot control device and the elapsed time clocked by the simulation device to be shorter than 0.1 millisecond.

Another aspect of the invention is directed to a robot controlled by the robot control device described above.

With this configuration, the robot is controlled on the basis of the simulation result of the simulation device that performs the simulation in which the difference between the time when the virtual robot control device performs the predetermined first operation and the time when the robot control device performs the second operation corresponding to the first operation is shorter than 1 millisecond. Consequently, the robot can suppress a shift between timing when the robot is caused to perform predetermined operation by the robot control device and timing when a virtual robot is caused to perform the operation by the virtual robot control device.

Another aspect of the invention is directed to a simulation device that performs a simulation of operation of the virtual robot control device on a virtual space. A difference between time when the virtual robot control device performs predetermined operation and time when a real robot control device corresponding to the virtual robot control device performs the predetermined operation is shorter than 1 millisecond.

With this configuration, the simulation device performs the simulation in which the difference between the time when the virtual robot control device performs the predetermined operation and the time when a real robot control device corresponding to the virtual robot control device performs the predetermined operation is shorter than 1 millisecond. Consequently, the simulation device can suppress a shift between timing when the virtual robot control device performs first operation and timing when the robot control device performs second operation.

As explained above, the robot control device controls the robot on the basis of the simulation result of the simulation device that performs the simulation in which the difference between the time when the virtual robot control device performs the predetermined first operation and the time when the robot control device performs the second operation corresponding to the first operation is shorter than 1 millisecond. Consequently, the robot control device can suppress a shift between timing when the robot control device performs the second operation and timing when the virtual robot control device performs the first operation.

The robot is controlled on the basis of the simulation result of the simulation device that performs the simulation in which the difference between the time when the virtual robot control device performs the predetermined first operation and the time when the robot control device performs the second operation corresponding to the first operation is shorter than 1 millisecond. Consequently, the robot can suppress a shift between timing when the robot is caused to perform predetermined operation by the robot control device and timing when a virtual robot is caused to perform the operation by the virtual robot control device.

The simulation device performs the simulation in which the difference between the time when the virtual robot control device performs the predetermined operation and the time when a real robot control device corresponding to the virtual robot control device performs the predetermined operation is shorter than 1 millisecond. Consequently, the simulation device can suppress a shift between timing when the virtual robot control device performs the first operation and timing when the robot control device performs the second operation.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

A first embodiment of the invention is explained below with reference to the drawings.

Configuration of a Robot System

First, the configuration of a robot system 1 is explained.

Figure 1:
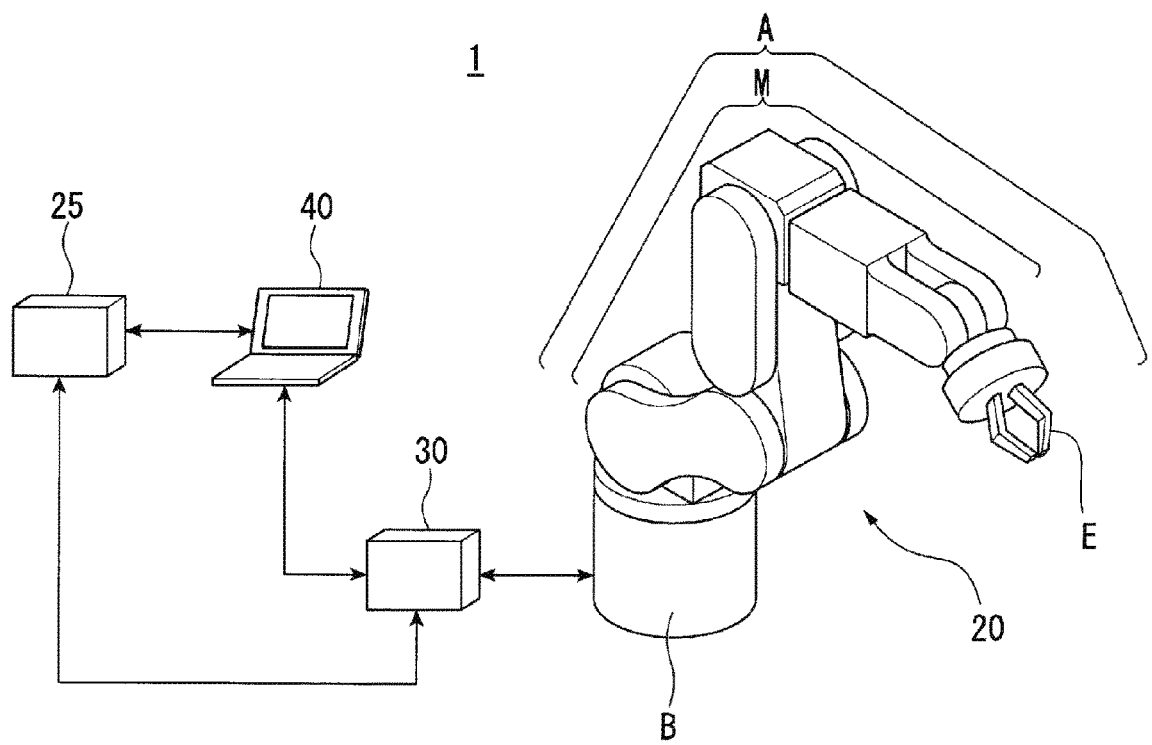
FIG. 1 is a diagram showing an example of the configuration of a robot system according to a first embodiment.

FIG. 1 is a diagram showing an example of the configuration of the robot system 1 according to this embodiment. The robot system 1 includes a robot 20, a peripheral device 25, a robot control device 30, and a simulation device 40.

The robot 20 is a single-arm robot including an arm A and a supporting stand B that supports the arm A. The single-arm robot is a robot including one arm like the arm A in this example. Note that the robot 20 may be a plural-arm robot instead of the single-arm robot. The plural-arm robot is a robot including two or more arms (e.g., two or more arms A). Note that, among plural-arm robots, a robot including two arms is referred to as double-arm robot as well. That is, the robot 20 may be a double-arm robot including two arms or may be a plural-arm robot including three or more arms (e.g., three or more arms A). The robot 20 may be another robot such as a SCARA robot or a Cartesian coordinate robot. The Cartesian coordinate robot is, for example, a gantry robot.

The arm A includes an end effector E and a manipulator M.

In this example, the end effector E is an end effector including finger sections capable of gripping an object. Note that the end effector E may be an end effector capable of lifting an object with the suction of the air, a magnetic force, a jig, or the like or another end effector instead of the end effector including the finger sections.

The end effector E is communicatively connected to the robot control device 30 by a cable. Consequently, the end effector E performs a motion based on a control signal acquired from the robot control device 30. Note that wired communication via the cable is performed according to a standard such as the Ethernet (registered trademark) or the USB (Universal Serial Bus). The end effector E may be connected to the robot control device 30 by wireless communication performed according to a communication standard such as the Wi-Fi (registered trademark).

The manipulator M includes six joints. The six joints respectively include not-shown actuators. That is, the arm A including the manipulator M is an arm of a six-axis vertical multi-joint type. The arm A performs a motion of a six-axis degree of freedom according to associated operation by the supporting stand B, the end effector E, the manipulator M, and the actuators of the respective six joints included in the manipulator M. Note that the arm A may move at a degree of freedom of five or less axes or may move at a degree of freedom of seven or more axes.

The six actuators (included in the joints) included in the manipulator M are respectively communicatively connected to the robot control device 30 by cables. Consequently, the actuators operate the manipulator M on the basis of a control signal acquired from the robot control device 30. Note that wired communication via the cables is performed according to a standard such as the Ethernet (registered trademark) or the USB. A part or all of the six actuators included in the manipulator M may be connected to the robot control device 30 by wireless communication performed according to a communication standard such as the Wi-Fi (registered trademark).

The peripheral device 25 and the simulation device 40 are communicatively connected to each other by a cable. The simulation device 40 and the robot control device 30 are communicatively connected to each other by a cable. The robot control device 30 and the peripheral device 25 are communicatively connected to each other by a cable. Wired communication via the cables is performed according to a standard such as the Ethernet (registered trademark) or the USB. The peripheral device 25 may be connected to the simulation device 40 by wireless communication performed according to a communication standard such as the Wi-Fi (registered trademark). The simulation device 40 may be connected to the robot control device 30 by wireless communication performed according to a communication standard such as the Wi-Fi (registered trademark). The robot control device 30 may be connected to the peripheral device 25 by wireless communication performed according to a communication standard such as the Wi-Fi (registered trademark).

The peripheral device 25 is a device that performs transmission and reception of information to and from the robot control device 30. For example, the peripheral device 25 is sensor such as a temperature sensor that detects the temperature in a position where the peripheral device 25 is set or a force sensor that detects an external force applied to the end effector E. Note that the peripheral device 25 may be another device if the device is a device that performs transmission and reception of information to and from the robot control device 30 such as an operation panel or a teaching pendant. In the following explanation, as an example, the peripheral device 25 is the temperature sensor.

The peripheral device 25 acquires, from the robot control device 30, acquisition request information indicating a request for acquisition of temperature information indicating temperature detected by the peripheral device 25. The peripheral device 25 outputs the temperature information to the robot control device 30 on the basis of the acquired acquisition request information. The peripheral device 25 acquires the acquisition request information from a virtual robot control device VC virtually generated in a storage region of the simulation device 40. The peripheral device 25 outputs the temperature information to the virtual robot control device VC, that is, the simulation device 40 on the basis of the acquired acquisition request information.

The simulation device 40 is an information processing device such as a work station, a desktop PC (Personal Computer), a notebook PC, a table PC, a multifunction cellular phone terminal (a smartphone), an electronic book reader with a communication function, or a PDA (Personal Digital Assistant).

The simulation device 40 performs a simulation of the operation of the virtual robot control device VC on a virtual space VS on the basis of operation received from a user. The virtual space VS means a virtual space generated in the storage region of the simulation device 40 by the simulation device 40. In the simulation, the simulation device 40 causes the virtual robot control device VC to control (operate) a virtual robot VR on the virtual space VS. The virtual robot VR is a virtual robot corresponding to the robot 20. The virtual robot control device VC operating on the virtual space VS generates, on the basis of an operation program input by the user in advance, a control signal for operating the virtual robot VR. The virtual robot control device VC outputs the generated control signal to the virtual robot VR and causes the virtual robot VR to perform predetermined work.

When causing the virtual robot VR to perform the predetermined work, the virtual robot control device VC performs predetermined first operation. In this example, the first operation is operation for outputting acquisition request information to the peripheral device 25 on the basis of the operation program and acquiring temperature information, which is a response of the peripheral device 25 to the output acquisition request information. Note that the first operation may be another kind of operation instead of this operation. The virtual robot control device VC controls the virtual robot VR on the basis of the temperature information acquired by the first operation. For example, when temperature indicated by the temperature information acquired by the first operation is equal to or higher than a predetermined threshold, the virtual robot control device VC stops the operation of the virtual robot VR. Note that the virtual robot control device VC may cause the virtual robot VR to perform another kind of operation based on the temperature indicated by the temperature information. The acquisition request information is an example of information that the virtual robot control device VC outputs to the peripheral device 25 according to the first operation. The temperature information is an example of information that the virtual robot control device VC acquires from the peripheral device 25 according to the first operation.

In this example, the robot control device 30 is a robot controller. The robot control device 30 is a real robot control device corresponding to the virtual robot control device VC. The robot control device 30 controls the robot 20 on the basis of a simulation result of the simulation device 40. Specifically, the robot control device 30 generates, on the basis of the operation program acquired from the simulation device 40 as the simulation result, a control signal for operating the robot 20. The robot control device 30 outputs the generated control signal to the robot 20 and causes the robot 20 to perform predetermined work.

When causing the robot 20 to perform the predetermined work, the robot control device 30 performs second operation corresponding to the first operation. In this example, the second operation is operation for outputting acquisition request information to the peripheral device 25 on the basis of the operation program and acquiring temperature information, which is a response of the peripheral device 25 to the output acquisition request information. Note that the second operation may be another kind of operation instead of this operation if the operation is operation corresponding to the first operation. The robot control device 30 controls the robot 20 on the basis of the temperature information acquired by the second operation. For example, when temperature indicated by the temperature information acquired by the second operation is equal to or higher than a predetermined threshold, the robot control device 30 stops the operation of the robot 20. Note that the robot control device 30 may cause the robot 20 to perform another kind of operation based on the temperature indicated by the temperature information. The acquisition request information is an example of information that the robot control device 30 outputs to the peripheral device 25 according to the second operation. The temperature information is an example of information that the robot control device 30 acquires from the peripheral device 25 according to the second operation.

Overview of Processing Performed by the Simulation Device

An overview of processing performed by the simulation device 40 is explained below.

The simulation device 40 is not a device exclusive for simulation installed with a real time OS (Operating System) and is an information processing device installed with an OS having a general-purpose multitask function. Therefore, even if the simulation device 40 attempts to execute predetermined processing through an interrupt every time a predetermined time elapses, in some case, other processing having higher priority than the predetermined processing is executed earlier and the predetermined processing is executed after time longer than the predetermined time elapses.

On the other hand, the robot control device 30 is installed with a dedicated OS and executes predetermined processing every time a predetermined time elapses. When the simulation device 40 executes the predetermined processing after the time longer than the predetermined time elapses, a shift occurs between time when the virtual robot control device VC performs first operation in a simulation by the simulation device 40 and time when the robot control device 30 performs second operation corresponding to the first operation. As a result, the simulation device 40 sometimes cannot cause the virtual robot control device VC to perform operation same as the operation of the robot control device 30 through the simulation.

Therefore, the simulation device 40 acquires a clock number counted by a counter included in a CPU 41 from the counter. The CPU 41 not shown in FIG. 1 is explained below. The clock number means the number of pulses of a clock signal for operating the CPU 41. The simulation device 40 clocks an elapsed time on the basis of a quotient and a remainder obtained when a number based on the acquired clock number is divided by a predetermined clock number associated with the predetermined time.

Specifically, the simulation device 40 clocks an elapsed time on the basis of a quotient and a remainder obtained when a difference between a clock number acquired at certain timing (an example of the clock number acquired in the last processing) and a clock number acquired in the next timing of the timing (an example of the clock number acquired in the present processing) is divided by the predetermined clock number. The simulation device 40 executes, according to the clocked elapsed time, the predetermined processing every time the predetermined time elapses. Consequently, the simulation device 40 can execute the predetermined processing every time the predetermined time elapses. In the following explanation, as an example, the predetermined time is 1 millisecond. Note that the predetermined time may be time shorter than 1 millisecond such as 0.5 millisecond or 0.1 millisecond instead of 1 millisecond.

According to such a clocking method, the simulation device 40 performs a simulation in which a difference between time when the virtual robot control device VC performs the first operation and time when the robot control device 30, which is a real robot control device corresponding to the virtual robot control device VC, performs the second operation is shorter than 1 millisecond. As a result, the simulation device 40 can suppress a shift between the time when the virtual robot control device VC performs the first operation and the time when the robot control device 30 performs the second operation.

In the following explanation, processing in which the simulation device 40 clocks an elapsed time is explained in detail.

Hardware Configuration of the Simulation Device and the Robot Control Device

A hardware configuration of the simulation device 40 and the robot control device 30 is explained with reference to FIG. 2.

Figure 2:
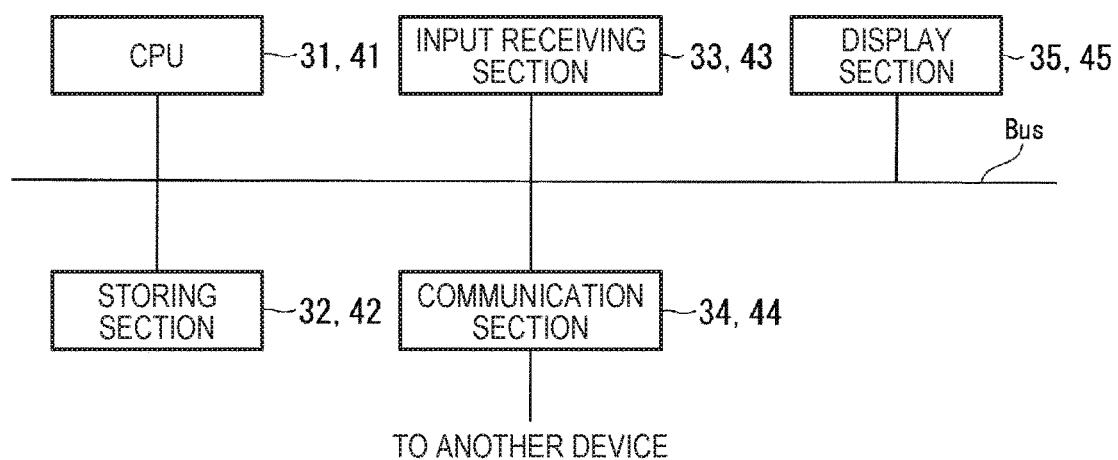
FIG. 2 a diagram showing an example of a hardware configuration of a simulation device and a robot control device.

FIG. 2 is a diagram showing an example of the hardware configuration of the simulation device 40 and the robot control device 30. FIG. 2 is a diagram showing a hardware configuration of the simulation device 40 (functional sections added with reference numerals in fortieth in FIG. 2) and a hardware configuration of the robot control device 30 (functional sections added with reference numerals in thirties in FIG. 2) together for convenience.

The simulation device 40 includes, for example, the CPU (Central Processing Unit) 41, a storing section 42, an input receiving section 43, a communication section 44, and a display section 45. The simulation device 40 performs communication with each of the peripheral device 25 and the robot control device 30 via the communication section 44. These components are communicatively connected to one another via a bus Bus.

The CPU 41 executes various computer programs stored in the storing section 42. The CPU 41 includes the not-shown counter explained above.

The storing section 42 includes, for example, a HDD (Hard Disk Drive) or an SSD (Solid State Drive), an EEPROM (Electrically Erasable Programmable Read-Only Memory), a ROM (Read-Only Memory), or a RAM (Random Access Memory). Note that the storing section 42 may be, instead of a storing section incorporated in the simulation device 40, an external storage device connected by, for example, a digital input/output port such as the USB. The storing section 42 stores various kinds of information and images to be processed by the simulation device 40, various computer programs including an operation program, and the like.

The input receiving section 43 is, for example, a touch panel configured integrally with the display section 45. Note that the input receiving section 43 may be a keyboard, a mouse, a touch pad, or another input device.

The communication section 44 includes, for example, a digital input/output port such as the USB or an Ethernet (registered trademark) port.

The display section 45 is, for example, a liquid crystal display panel or an organic EL (Electro Luminescence) display panel.

The robot control device 30 includes, for example, a CPU 31, a storing section 32, an input receiving section 33, a communication section 34, and a display section 35. The robot control device 30 performs communication with each of the robot 20 and the peripheral device 25 via the communication section 34. These components are communicatively connected to one another via a bus Bus.

The CPU 31 executes various computer programs stored in the storing section 32.

The storing section 32 includes, for example, a HDD or an SSD, an EEPROM, a ROM, or a RAM. Note that the storing section 32 may be, instead of a storing section incorporated in the robot control device 30, an external storage device connected by, for example, a digital input/output port such as the USB. The storing section 32 stores various kinds of information and images to be processed by the robot control device 30, various computer programs including an operation program, and the like.

The input receiving section 33 is, for example, a touch panel configured integrally with the display section 35. Note that the input receiving section 33 may be a keyboard, a mouse, a touch pad, or another input device.

The communication section 34 includes, for example, a digital input/output port such as the USB or an Ethernet (registered trademark) port.

The display section 35 is, for example, a liquid crystal display panel or an organic EL display panel.

Functional Configurations of the Simulation Device and the Robot Control Device

Functional configurations of the simulation device 40 and the robot control device 30 are explained below with reference to FIG. 3.

Figure 3:
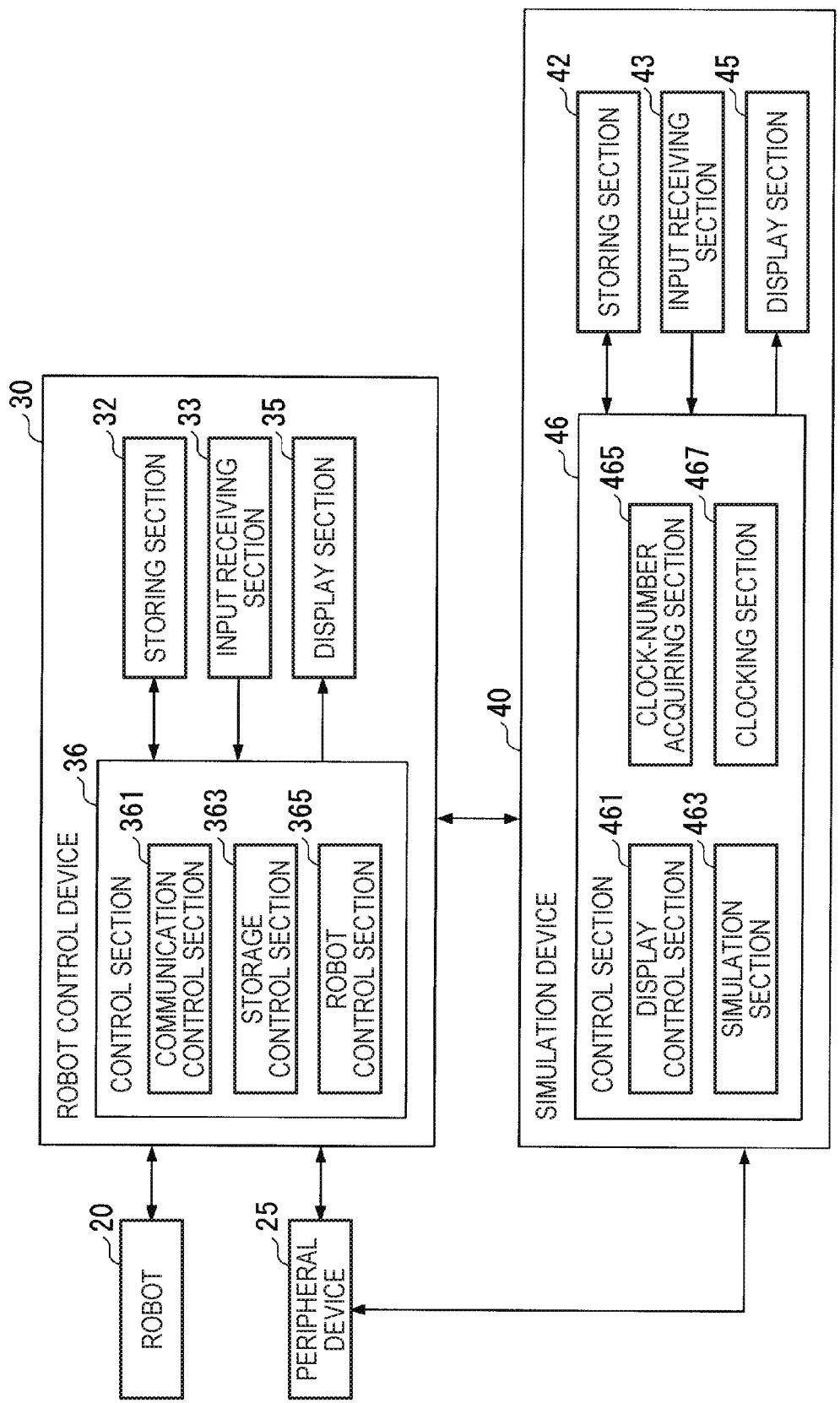
FIG. 3 is a diagram showing an example of functional configurations of the simulation device and the robot control device.

FIG. 3 is a diagram showing an example of the functional configurations of the simulation device 40 and the robot control device 30.

The simulation device 40 includes the storing section 42, the input receiving section 43, the display section 45, and a control section 46.

The control section 46 controls the entire simulation device 40. The control section 46 includes a display control section 461 a simulation section 463, a clock-number acquiring section 465, and a clocking section 467. These functional sections included in the control section 46 are realized by, for example, the CPU 41 executing the various computer programs stored in the storing section 42. Apart or all of the functional sections may be hardware functional sections such as an LSI (Large Scale Integration) and an ASIC (Application Specific Integrated Circuit).

The display control section 461 generates various screens on the basis of operation received from the user. The display control section 461 causes the display section 45 to display the generated various screens.

The simulation section 463 generates the virtual space VS in a storage region of the storing section 42. The simulation section 463 generates the virtual robot VR and the virtual robot control device VC on the generated virtual space VS. The simulation device 40 operates the virtual robot control device VC and operates the virtual robot VR on the virtual space VS on the basis of operation received from the user. That is, the simulation section 463 performs a simulation of the operation of the virtual robot control device VC on the virtual space VS. When the simulation section 463 performs the simulation of the operation of the virtual robot control device VC, the simulation section 463 performs the simulation on the basis of an elapsed time clocked by the clocking section 467.

The clock-number acquiring section 465 acquires a clock number from the counter included in the CPU 41.

The clocking section 467 clocks an elapsed time on the basis of the clock number acquired by the clock-number acquiring section 465.

The robot control device 30 includes the storing section 32, the input receiving section 33, the display section 35, and a control section 36.

The control section 36 controls the entire robot control device 30. The control section 36 includes a communication control section 361, a storage control section 363, and a robot control section 365. These functional sections included in the control section 36 are realized by, for example, the CPU 31 executing the various computer programs stored in the storing section 32. A part or all of the functional sections may be hardware functional sections such as an LSI and an ASIC.

The communication control section 361 outputs information to the peripheral device 25. The communication control section 361 acquires information from the peripheral device 25. In this example, the communication control section 361 outputs acquisition request information to the peripheral device 25. The communication control section 361 acquires temperature information, which is a response of the peripheral device 25 to the output acquisition request information.

The storage control section 363 acquires information indicating an operation program output from the simulation section 463. The storage control section 363 causes the storing section 32 to store the operation program indicated by the acquired information.

The robot control section 365 controls (operates), according to operation received from the user, the robot 20 on the basis of the operation program stored in the storing section 32.

Processing in which the Simulation Device Clocks an Elapsed Time

Processing in which the simulation device 40 clocks an elapsed time is explained with reference to FIG. 4.

Figure 4:
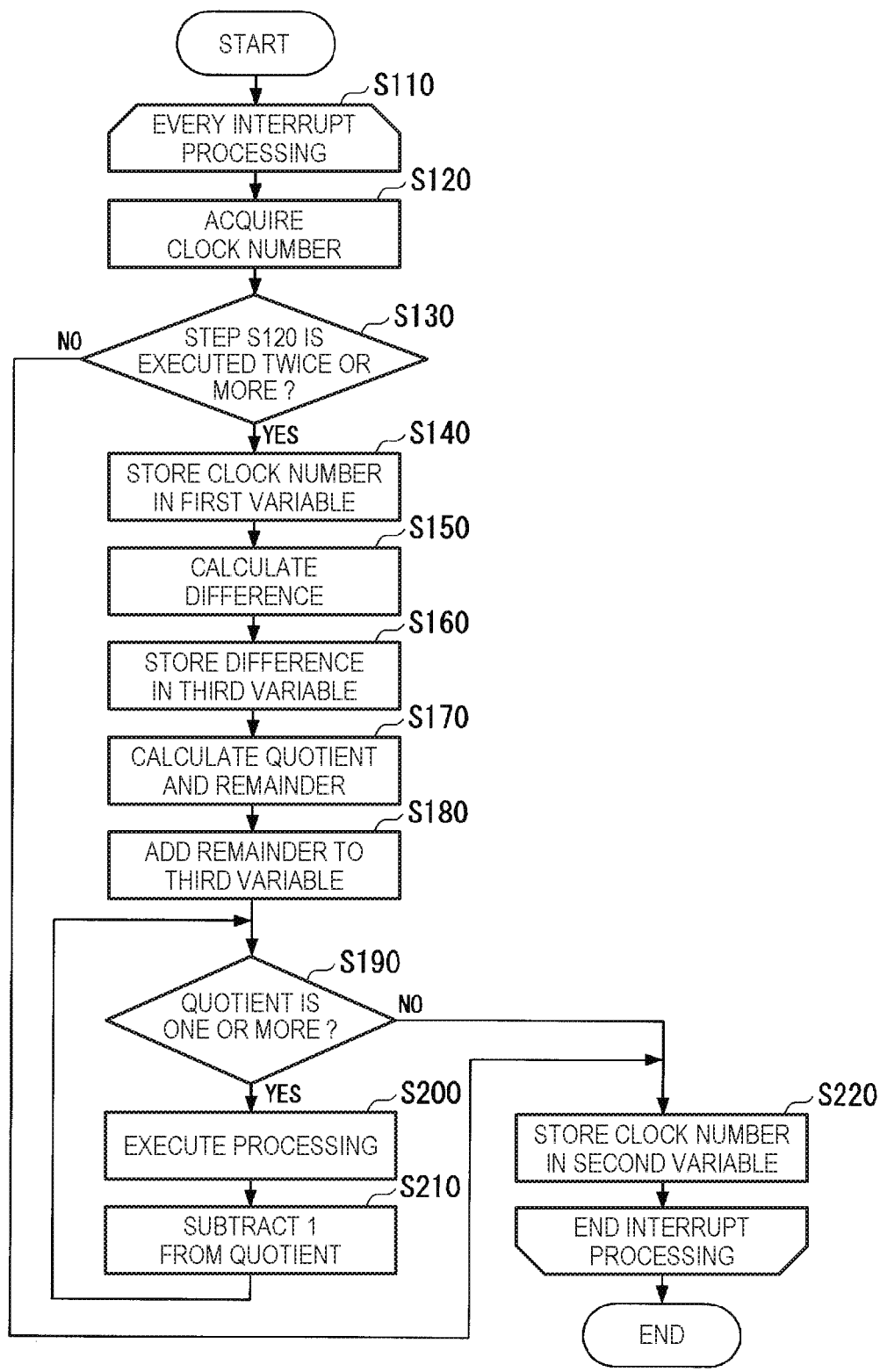
FIG. 4 is a flowchart for explaining an example of a flow of processing in which the simulation device clocks an elapsed time.

FIG. 4 is a flowchart for explaining an example of a flow of the processing in which the simulation device 40 clocks an elapsed time. In the flowchart of FIG. 4, before the processing of the flowchart of FIG. 4 is started, the simulation device 40 already generates the virtual space VS in the storage region of the storing section 42 and generates the virtual robot VR and the virtual robot control device VC on the generated virtual space VS. In the following explanation, the simulation device 40 generates, in advance, three variables, that is, a first variable, a second variable, and a third variable, which are variables in which 0 is stored as initial values and numbers can be stored.

After receiving, from the user, operation for starting the operation of the virtual robot control device VC on the virtual space VS, the simulation section 463 acquires time clocked by a not-shown OS. The simulation section 463, the clock-number acquiring section 465, and the clocking section 467 repeatedly perform processing in steps S120 to S220 every time the simulation section 463 determines on the basis of the time acquired by the simulation section 463 that a predetermined time has elapsed (step S110).

The time clocked by the not-shown OS sometimes delays because of interrupt processing. Therefore, the processing in steps S120 to S220 is not always performed every time a real predetermined time elapses and is executed by the simulation section 463, the clock-number acquiring section 465, and the clocking section 467 every time the simulation section 463 determines on the basis of the time that the predetermined time has elapsed. Note that, in this example, the predetermined time is 1 millisecond as explained above.

After the simulation section 463 determines in step S110 that the predetermined time has elapsed, the clock-number acquiring section 465 acquires a clock number from the counter included in the CPU 41 (step S120). Subsequently, the clock-number acquiring section 465 determines whether the processing in step S120 has been executed twice or more after the operation for starting the operation of the virtual robot control device VC is received (step S130).

When determining that the processing in step S120 has not been executed twice or more after the operation for starting the operation of the virtual robot control device VC is received (NO in step S130), the clock-number acquiring section 465 stores the clock number acquired in step S120 in the second variable (step S220). The simulation section 463 shifts to step S110 and stays on standby until the predetermined time elapses again. Note that, in this example, the storing the clock number in the second variable means changing the number stored in the second variable to the clock number.

On the other hand, when determining that the processing in step S120 has been executed twice or more after the operation for starting the operation of the virtual robot control device VC is received (YES in step S130), the clock-number acquiring section 465 stores the clock number acquired in step S120 in the first variable (step S140). Note that, in this example, the storing the clock number in the first variable means changing the number stored in the first variable to the clock number.

After the processing in step S140 is executed, the clocking section 467 calculates a difference between the number stored in the first variable and the number stored in the second variable (step S150). Subsequently, the clocking section 467 stores the difference calculated in step S150 in the third variable (step S160). Note that, in this example, the storing the difference in the third variable means changing the number stored in the third variable to the difference.

Subsequently, the clocking section 467 calculates a quotient and a remainder obtained when the number stored in the third variable is divided by a predetermined clock number associated with the predetermined time (step S170). In this example, the predetermined clock number is a value determined according to the predetermined time and a clock frequency of a not-shown CPU 41. For example, the predetermined clock number is $10^6$ when the predetermined time is 1 millisecond and the clock frequency is 1 gigahertz.

Subsequently, the clocking section 467 adds the remainder calculated in step S170 to the third variable (step S180). Note that, in this example, the adding the remainder to the third variable means storing anew, in the third variable, a number obtained by adding the remainder to the number stored in the third variable.

Subsequently, the clocking section 467 determines whether the quotient calculated in step S170 is equal to or larger than 1 (step S190). When the clocking section 467 determines that the quotient calculated in step S170 is not equal to or larger than 1 (NO in step S190), the clock-number acquiring section 465 shifts to step S220 and stores the clock number acquired in step S120 in the second variable. On the other hand, when the clocking section 467 determines that the quotient calculated in step S170 is equal to or larger than 1 (YES in step S190), the simulation section 463 causes the virtual robot control device VC to determine that the predetermined time has elapsed and causes the virtual robot control device VC to execute processing performed when the predetermined time has elapsed (step S200). For example, when the virtual robot control device VC performs the first operation every time the predetermined time elapses, the virtual robot control device VC performs the first operation every time the processing in step S200 is executed and acquires temperature information from the peripheral device 25.

Subsequently, the clocking section 467 subtracts 1 from the quotient calculated in step S170 (step S210). The clocking section 467 shifts to step S190 and determines whether the quotient, from which 1 is subtracted in step S210, is equal to or larger than 1.

As explained above, the simulation device 40 repeatedly performs the processing in steps S120 to S220 every time the simulation section 463 determines on the basis of the time acquired from the not-shown OS that the predetermined time has elapsed. Consequently, for example, even when the simulation section 463 determines on the basis of the time acquired from the OS that the predetermined time has elapsed after time longer than the predetermined time has elapsed. The simulation device 40 corrects, with the remainder stored in the third variable when the processing in steps S120 to S220 is executed next, an interval until the simulation section 463 causes the virtual robot control device VC to determine that the predetermined time has elapsed. As a result, the simulation device 40 reduces the difference between the time when the virtual robot control device VC performs the first operation and the time when the robot control device 30 performs the second operation to be shorter than 1 millisecond. Note that, for example, when the predetermined time is 0.5 millisecond, the simulation device 40 reduces the difference to be shorter than 0.5 millisecond. For example, when the predetermined time is 0.1 millisecond, the simulation device 40 reduces the difference to be shorter than 0.1 millisecond. That is, the simulation device 40 can suppress the shift between the time when the virtual robot control device VC performs the first operation and the time when the robot control device 30 performs the second operation.

Processing in which the Simulation Device Performs a Simulation

Figure 5:
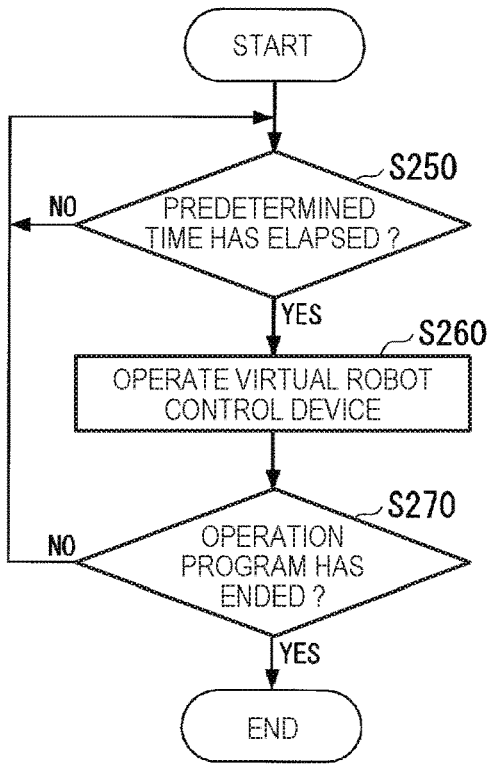
FIG. 5 is a flowchart for explaining an example of a flow of processing in which the simulation device performs a simulation.

Processing in which the simulation device 40 performs a simulation is explained below with reference to FIG. 5. FIG. 5 is a flowchart for explaining an example of the processing in which the simulation device 40 performs a simulation.

After receiving, from the user, operation for starting the operation of the virtual robot control device VC on the virtual space VS, the simulation section 463 determines whether the processing in step S200 shown in FIG. 4 is executed. That is, the simulation section 463 puts the virtual robot control device VC on standby until the predetermined time elapses (step S250). When the simulation section 463 determines that the predetermined time has elapsed (YES in step S250), the virtual robot control device VC operates, on the basis of the operation program stored in the storing section 42 in advance, the virtual robot control device VC for time equivalent to the elapsed time (step S260). For example, the simulation section 463 causes, on the basis of the operation program, the virtual robot control device VC to perform the first operation.

Subsequently, the simulation section 463 causes the virtual robot control device VC to determine whether the operation program has ended (step S270). For example, when the virtual robot control device VC has executed all commands described in the operation program, the virtual robot control device VC determines that the operation program has ended. When the virtual robot control device VC determines that the operation program has not ended (NO in step S270), the simulation section 463 shifts to step S250 and determines whether the processing in step S200 shown in FIG. 4 is executed again. On the other hand, when the virtual robot control device VC determines that the operation program has ended (YES in step S270), the simulation section 463 ends the processing.

In this way, the simulation device 40 can operate the virtual robot control device VC on the virtual space VS on the basis of the predetermined time clocked by the processing of the flowchart of FIG. 4 and perform the simulation of the operation of the virtual robot control device VC. Consequently, the simulation device 40 can suppress the shift between the time when the virtual robot control device VC performs the first operation and the time when the robot control device 30 performs the second operation.

Processing in which the Robot Control Device Acquires a Simulation Result of the Simulation Device Processing in which the robot control device 30 acquires a simulation result of the simulation device 40 is explained with reference to FIG. 6.

Figure 6:
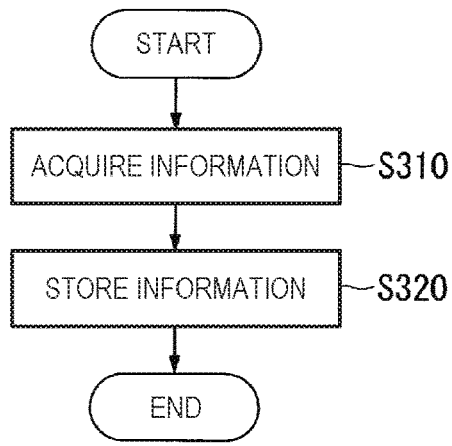
FIG. 6 is a flowchart for explaining an example of a flow of processing in which the robot control device acquires a simulation result of the simulation device.

FIG. 6 is a flowchart for explaining an example of a flow of the processing in which the robot control device 30 acquires a simulation result of the simulation device 40. Note that, in the flowchart of FIG. 6, a simulation of the simulation device 40 has already ended.

After the simulation device 40 outputs a simulation result of the simulation to the robot control device 30 on the basis of operation received from the user, the communication control section 361 acquires the simulation result from the simulation device 40 (step S310). In this example, the simulation result is information indicating an operation program with which the simulation device 40 operates the virtual robot control device VC in the simulation. Note that the simulation result may be, instead of this information, another kind of information such as setting values (various thresholds, force control parameters, and the like) set in the virtual robot control device VC in the simulation. Subsequently, the storage control section 363 causes the storing section 32 to store the simulation result acquired by the communication control section 361 in step S310 (step S320).

In this way, the robot control device 30 stores the simulation result of the simulation device 40. Consequently, the robot control device 30 can control the robot 20 on the basis of the simulation result of the simulation device 40. For example, the robot control section 365 included in the robot control device 30 reads out the operation program, which is the simulation result stored in the storing section 32, on the basis of operation received from the user. The robot control section 365 controls the robot 20 on the basis of the read-out operation program. As a result, the robot control device 30 can suppress the shift between the time when the virtual robot control device VC performs the first operation and the time when the robot control device 30 performs the second operation.

As explained above, the robot control device 30 controls the robot (in this example, the robot 20) on the basis of the simulation result of the simulation device that performs the simulation in which the difference between the time when the virtual robot control device (in this example, the virtual robot control device VC) performs the predetermined first operation and the time when the robot control device 30 performs the second operation corresponding to the first operation is shorter than 1 millisecond. Consequently, the robot control device 30 can suppress a shift between timing when the virtual robot control device performs the first operation and timing when the robot control device performs the second operation.

The robot control device 30 controls the robot on the basis of the simulation result of the simulation device that performs the simulation in which the difference between the time when the virtual robot control device performs the acquisition of the information from the peripheral device (in this example, the peripheral device 25) connected to the simulation device as the first operation and the time when the robot control device 30 performs the acquisition of the information from the peripheral device connected to the robot control device as the second operation corresponding to the first operation is shorter than 1 millisecond. Consequently, the robot control device 30 can suppress a shift between the time when the robot control device 30 performs the acquisition of the information from the peripheral device connected to the robot control device and the time when the virtual robot control device performs the acquisition of the information from the peripheral device connected to the simulation device.

The robot control device 30 controls the robot on the basis of the simulation result of the simulation device that performs the simulation in which the virtual robot control device controls the virtual robot on the basis of the information from the peripheral device acquired by the first operation. Consequently, the robot control device 30 can suppress a shift between the time when the robot control device 30 controls the robot on the basis of the information from the peripheral device acquired by the second operation and the time when the virtual robot control device controls the virtual robot on the basis of the information from the peripheral device acquired by the first operation.

The robot control device 30 controls the robot on the basis of the simulation result of the simulation device that performs the simulation in which the difference between the time when the virtual robot control device performs the output of the information to the peripheral device connected to the simulation device as the first operation and the time when the robot control device performs the output of the information to the peripheral device connected to the robot control device as the second operation corresponding to the first operation is shorter than 1 millisecond. Consequently, the robot control device 30 can suppress a shift between the time when the robot control device 30 performs the output of the information to the peripheral device connected to the robot control device 30 and the time when the virtual robot control device performs the output of the information to the peripheral device connected to the simulation device.

The robot control device 30 controls the robot on the basis of the simulation result of the simulation device that clocks an elapsed time on the basis of a quotient and a remainder obtained when the number based on the acquired clock number is divided by the predetermined clock number associated with the predetermined time. Consequently, the robot control device 30 can suppress as shift between an elapsed time clocked by the robot control device 30 and an elapsed time clocked by the simulation device.

The robot control device 30 controls the robot on the basis of the simulation result of the simulation device that clocks an elapsed time on the basis of a quotient and a remainder obtained when the difference between the clock number acquired in the last processing and the clock number acquired in the present processing is divided by the predetermined clock number associated with the predetermined time. Consequently, the robot control device 30 can suppress, on the basis of the difference between the clock number acquired in the last processing and the clock number acquired in the present processing, a shift between an elapsed time clocked by the robot control device 30 and an elapsed time clocked by the simulation device.

The robot control device 30 controls the robot on the basis of the simulation result of the simulation device that clocks an elapsed time on the basis of a quotient and a remainder obtained when the difference between the clock number acquired in the last processing and the clock number acquired the present processing is divided by the predetermined clock number associated with the time equal to or shorter than 1 millisecond. Consequently, the robot control device 30 can suppress a shift between an elapsed time clocked by the robot control device 30 and an elapsed time clocked by the simulation device to be shorter than 1 millisecond.

The robot control device 30 controls the robot on the basis of the simulation result of the simulation device that clocks an elapsed time on the basis of a quotient and a remainder obtained when the difference between the clock number acquired in the last processing and the clock number acquired in the present processing is divided by the predetermined clock number associated with time equal to or shorter than 0.5 millisecond. Consequently, the robot control device 30 can suppress a shift between an elapsed time clocked by the robot control device 30 and an elapsed time clocked by the simulation device to be shorter than 0.5 millisecond.

The robot control device 30 controls the robot on the basis of the simulation result of the simulation device that clocks an elapsed time on the basis of a quotient and a remainder obtained when the difference between the clock number acquired in the last processing and the clock number acquired in the present processing is divided by the predetermined clock number associated with time equal to or shorter than 0.1 millisecond. Consequently, the robot control device 30 can more surely suppress a shift between an elapsed time clocked by the robot control device 30 and an elapsed time clocked by the simulation device to be shorter than 0.1 millisecond.

The embodiment of the invention is explained in detail above with reference to the drawings. However, a specific configuration is not limited to this embodiment and may be, for example, changed, substituted, and deleted without departing from the spirit of the invention.

It is also possible to record, in a computer-readable recording medium, a computer program for realizing functions of any components in the devices (e.g., the simulation device 40 and the robot control device 30) explained above, cause a computer system to read the computer program, and execute the computer program. Note that the "computer system" includes an OS (an operating system) and hardware such as peripheral devices. The "computer-readable recording medium" refers to a portable medium such as a flexible disk, a magneto-optical disk, a ROM, or a CD (Compact Disk)-ROM or a storage device such as a hard disk incorporated in the computer system. Further, the "computer-readable recording medium" includes a recording medium that stores a computer program for a fixed time such as a volatile memory (a RAM) inside a computer system functioning as a server or a client when a computer program is transmitted via a network such as the Internet or a communication line such as a telephone line.

The computer program may be transmitted from a computer system, which stores the computer program in a storage device or the like, to another computer system via a transmission medium or by a transmission wave in the transmission medium. The "transmission medium", which transmits the computer program, refers to a medium having a function of transmitting information like a network (a communication network) such as the Internet or a communication line (a communication wire) such as a telephone line.

The computer program may be a computer program for realizing a part of the functions explained above. Further, the computer program may be a computer program that can realize the functions in a combination with a computer program already recorded in the computer system, a so-called differential file (a differential program).

Second Embodiment

A second embodiment of the invention is explained below with reference to the drawings.

Figure 7:
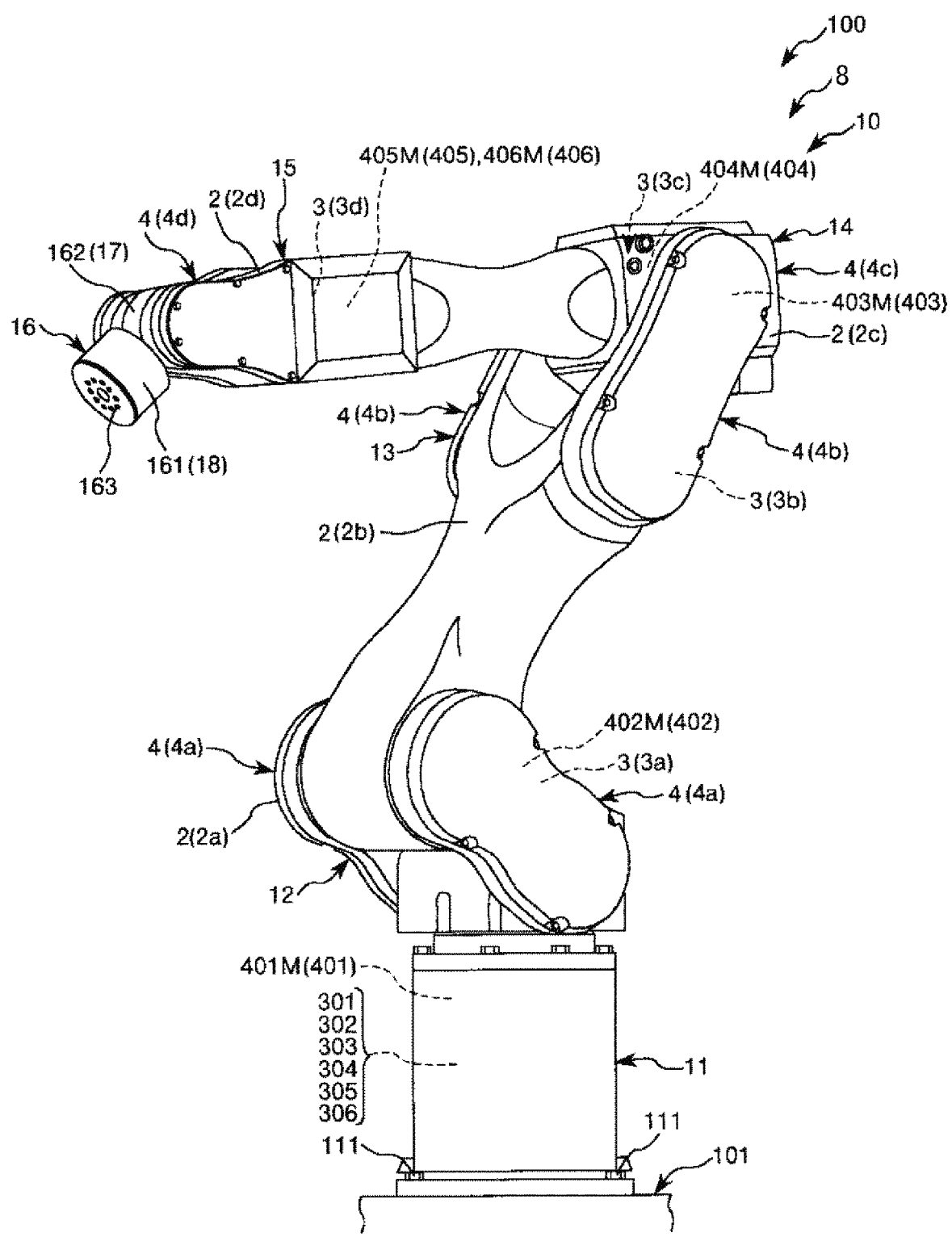
FIG. 7 is a perspective view of a robot according to a second embodiment viewed from the front side.
Figure 8:
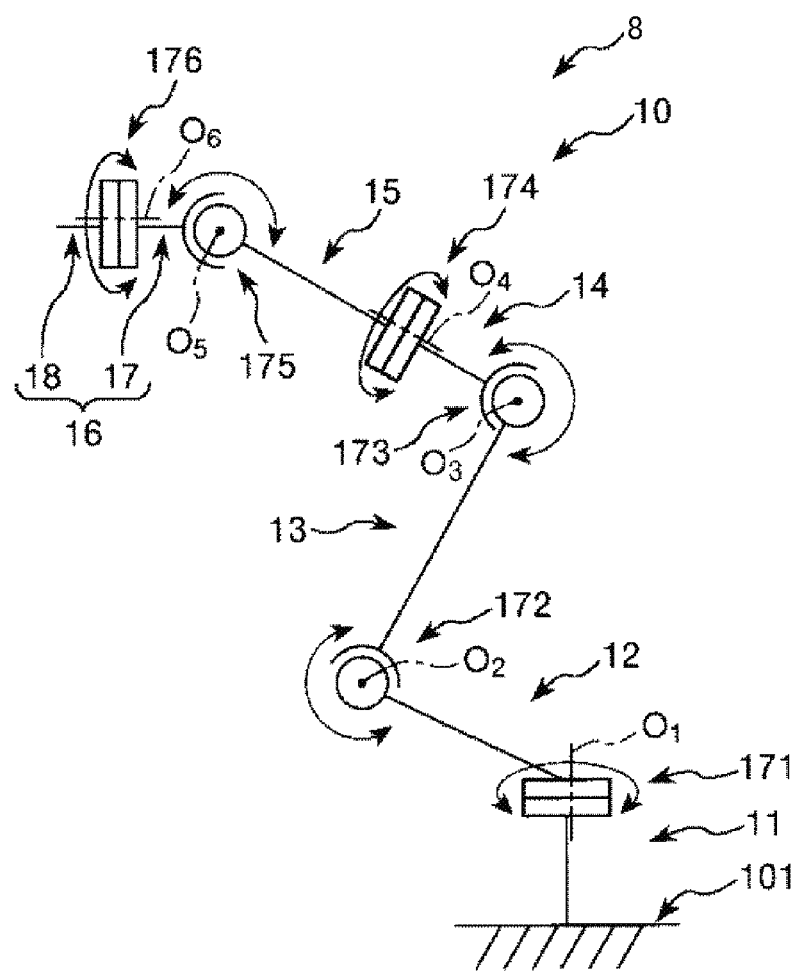
FIG. 8 is a schematic view of the robot shown in FIG. 7.
Figure 9:
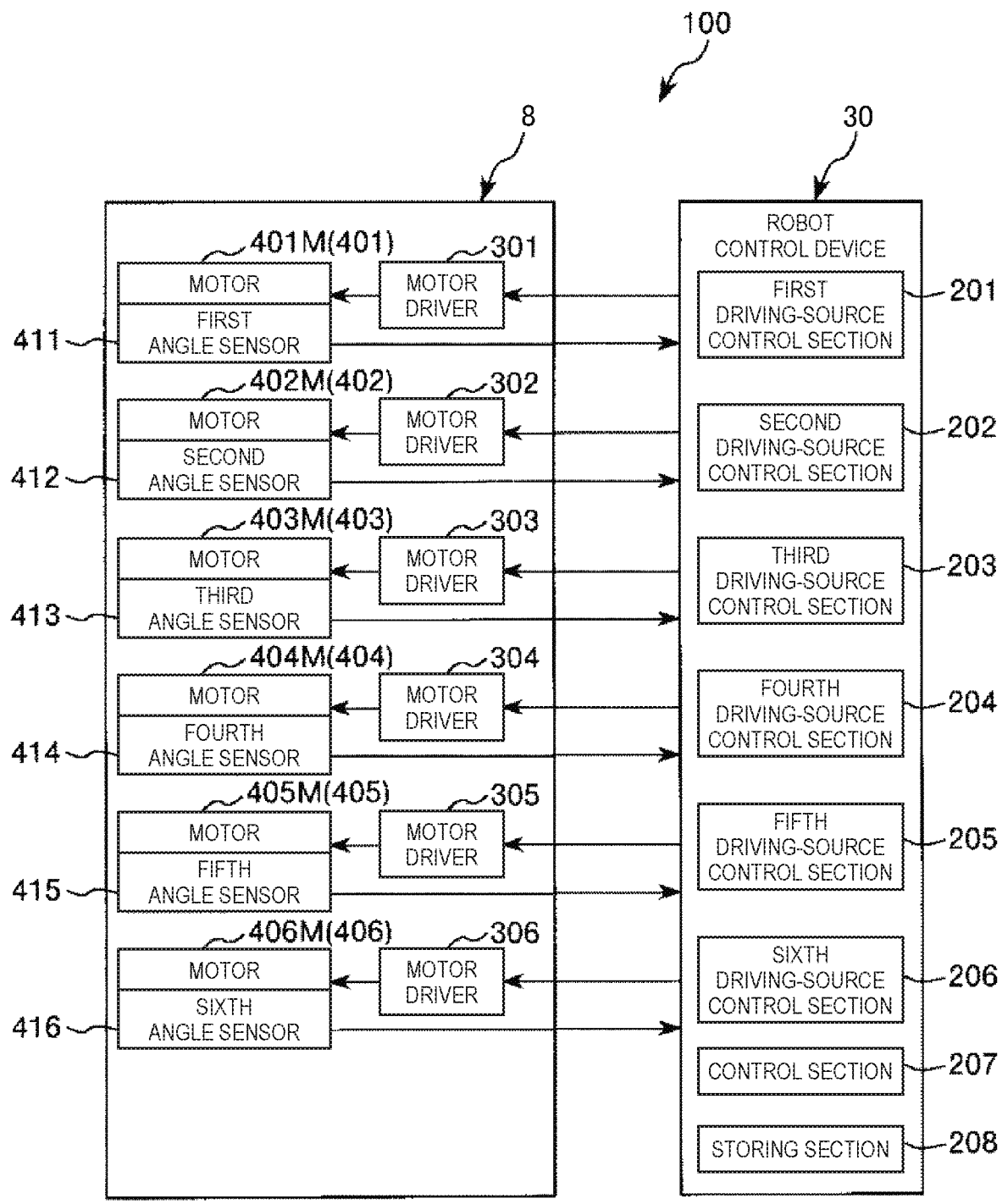
FIG. 9 is a block diagram of main parts of the robot and a robot control device.
Figure 10:
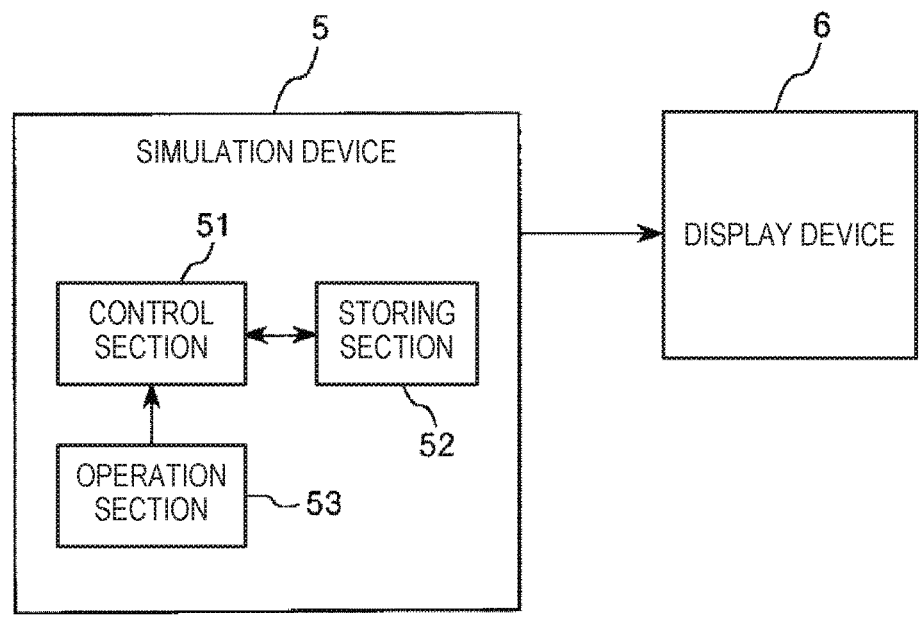
FIG. 10 is a block diagram showing a simulation device.
Figure 11:
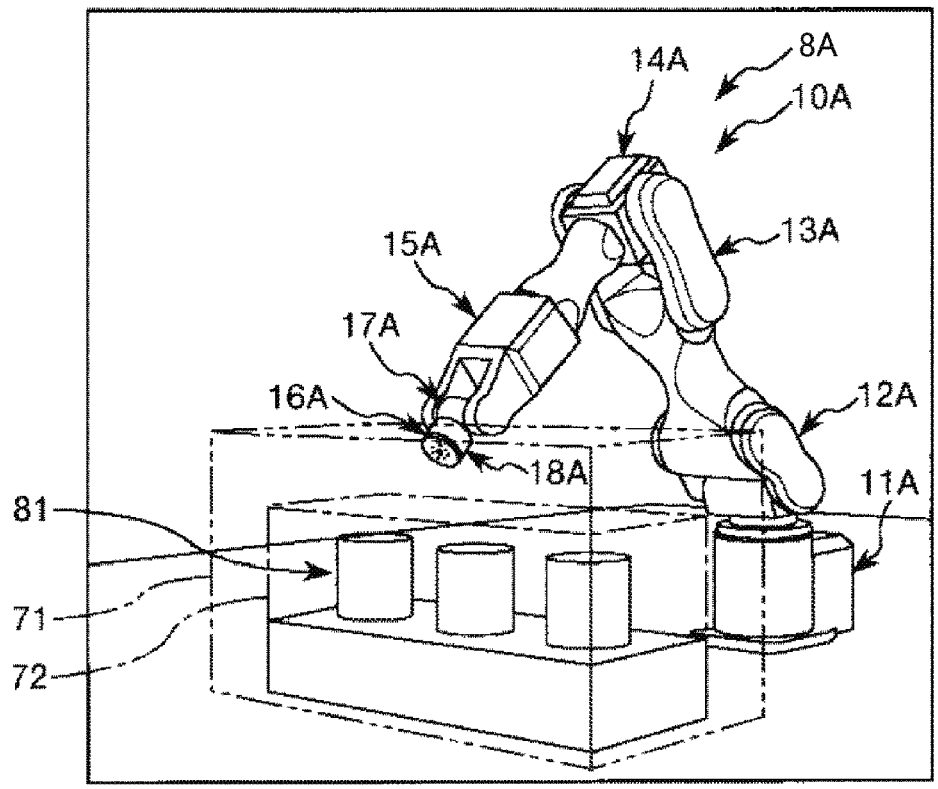
FIG. 11 is a diagram for explaining a simulation of the simulation device shown in FIG. 10.
Figure 12:
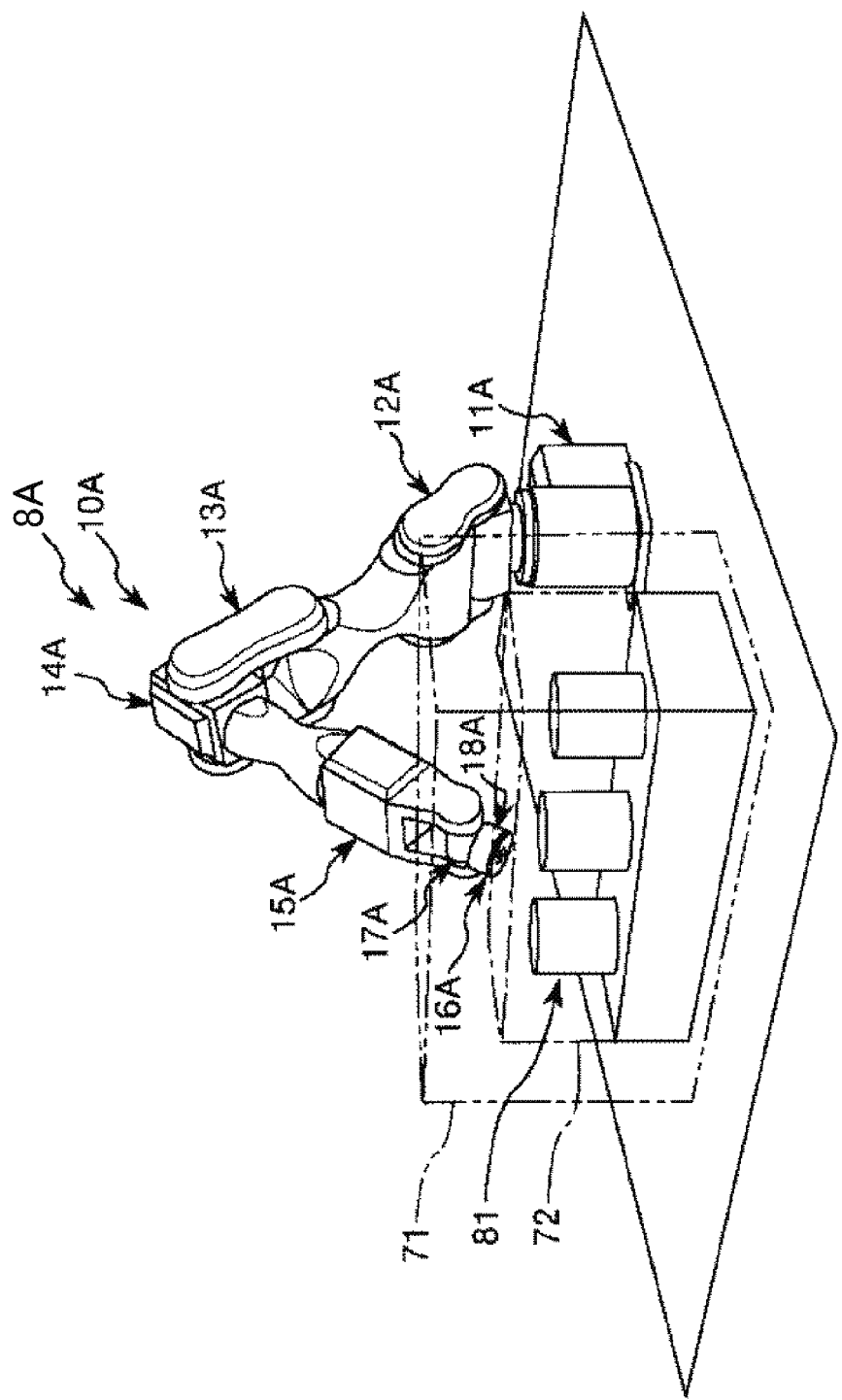
FIG. 12 is a diagram for explaining the simulation of the simulation device shown in FIG. 10.
Figure 13:
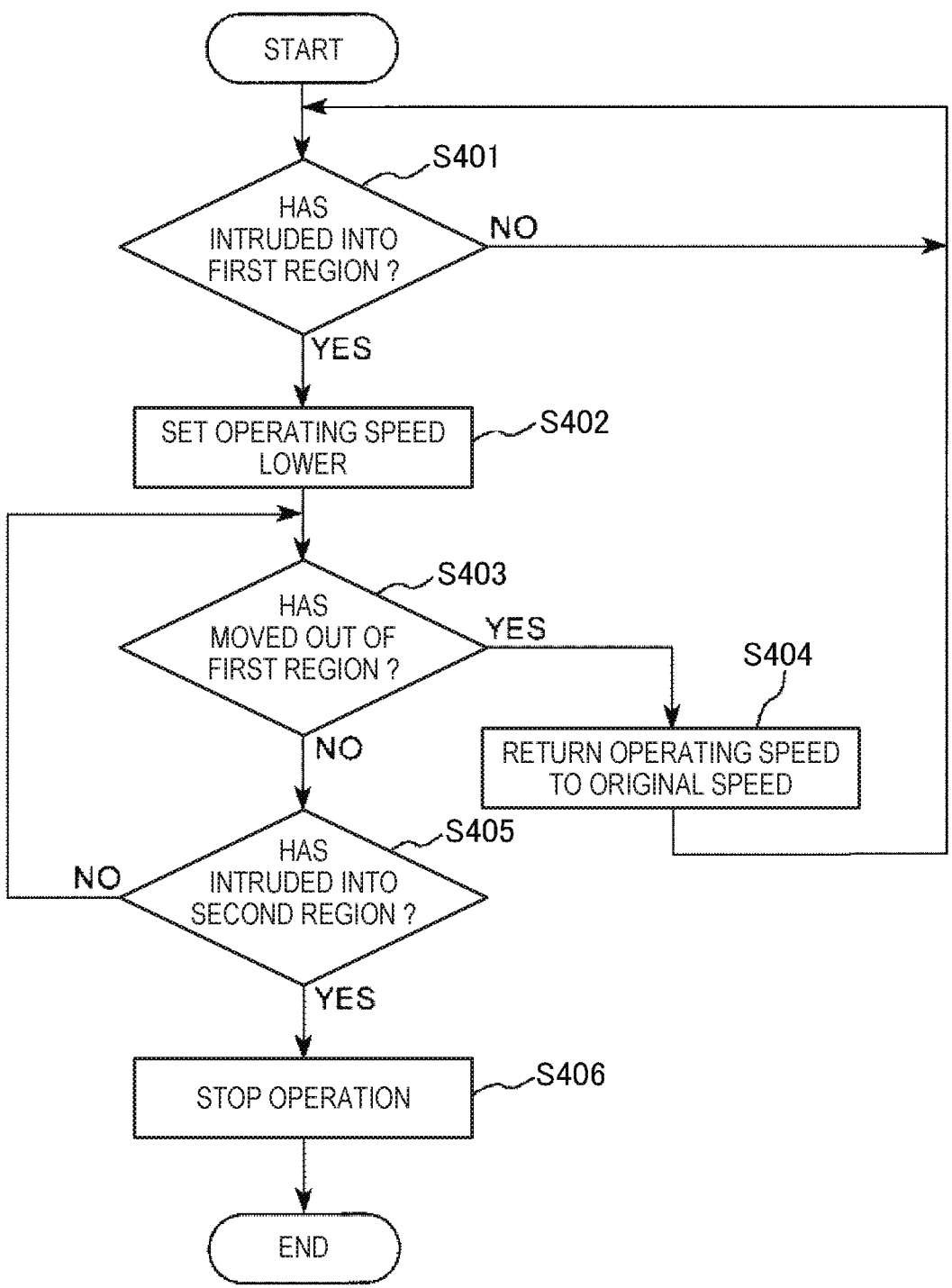
FIG. 13 is a flowchart for explaining control operation by the robot control device shown in FIG. 9.

FIG. 7 is a perspective view of a robot according to this embodiment viewed from the front side. FIG. 8 is a schematic diagram of the robot shown in FIG. 7. FIG. 9 is a block diagram of main parts of the robot and a robot control device. FIG. 10 is a block showing a simulation device. FIG. 11 is a diagram for explaining a simulation of the simulation device shown in FIG. 10. FIG. 12 is a diagram for explaining the simulation of the simulation device shown in FIG. 10. FIG. 13 is a flowchart for explaining control operation by the robot control device shown in FIG. 9.

Note that, in the following explanation, for convenience of explanation, the upper side in FIGS. 7, 8, 11, and 12 is referred to as "upper" or "upward" and the lower side is referred to as "lower" or "downward". The base side in FIGS. 7, 8, 11, and 12 is referred to as "proximal end" or "upstream" and the opposite side of the base side is referred to as "distal end" or "downstream. The up-down direction in FIGS. 7, 8, 11, and 12 is the vertical direction.

A contour of a display screen of a display device is shown in only FIG. 11. The display of the contour is omitted in the other figures.

A simulation device 5 shown in FIG. 10 is a device that performs a simulation of the operation of a virtual robot 8A on a virtual space. In this embodiment, the virtual space is a three-dimensional virtual space. However, the virtual space is not limited to this. The robot control device 30 shown in FIG. 9 controls the robot 8 on the basis of a simulation result of the simulation of the simulation device 5.

Note that signs of sections of the virtual robot 8A are written with "A" added behind signs of the corresponding sections of a real robot 8. Names of the sections of the virtual robot 8A are written with "virtual" added in front of names of the corresponding sections of the real robot 8. Explanation of the virtual robot 8A is substituted by explanation of the robot 8.

First, the robot 8 and the robot control device 30 are explained.

A robot system 100 shown in FIGS. 7 to 9 includes the robot 8 and the robot control device 30 that controls the robot 8. That is, the robot 8 is controlled by the robot control device 30. A use of the robot system 100 is not particularly limited. However, the robot system 100 can be used in, for example, a manufacturing process for manufacturing a precision instrument such as a wristwatch.

A part or the entire robot control device 30 may be incorporated in the robot 8. The robot control device 30 may be separate from the robot 8.

The robot control device 30 can be configured by, for example, a personal computer (PC) incorporating a CPU. The robot control device 30 includes a first driving-source control section 201 that controls actuation (driving) of a first driving source 401 explained below of the robot 8, a second driving-source control section 202 that controls actuation of a second driving source 402 of the robot 8, a third driving-source control section 203 that controls actuation of a third driving source 403 of the robot 8, a fourth driving-source control section 204 that controls actuation of a fourth driving source 404 of the robot 8, a fifth driving-source control section 205 that controls actuation of a fifth driving source 405 of the robot 8, a sixth driving-source control section 206 that controls actuation of a sixth driving source 406 of the robot 8, a control section 207, and a storing section 208 that stores various kinds of information.

As shown in FIGS. 7 and 8, the robot 8 includes a base 11 and a manipulator 10 (a robot arm). The manipulator 10 includes a first arm 12, a second arm 13, a third arm 14, a fourth arm 15, a fifth arm 17, and a sixth arm 18 and the first driving source 401, the second driving source 402, the third driving source 403, the fourth driving source 404, the fifth driving source 405, and the sixth driving source 406. A wrist 16 is configured by the fifth arm 17 and the sixth arm 18. An end effector (not shown in the figure) such as a hand can be detachably attached to the distal end portion of the sixth arm 18, that is, a distal end face 163 of the wrist 16. The robot 8 can perform respective kinds of work for, for example, while gripping a precision instrument, a component, or the like with the hand, conveying the precision instrument or the component by controlling motions of the arms 12 to 15, the wrist 16, and the like.

The robot 8 is a vertical multi-joint (six-axis) robot in which the base 11, the first arm 12, the second arm 13, the third arm 14, the fourth arm 15, the fifth arm 17, and the sixth arm 18 are coupled in this order from the proximal end side toward the distal end side. In the following explanation, the first arm 12, the second arm 13, the third arm 14, the fourth arm 15, the fifth arm 17, the sixth arm 18, and the wrist 16 are respectively referred to as "arms" as well. The first driving source 401, the second driving source 402, the third driving source 403, the fourth driving source 404, the fifth driving source 405, and the sixth driving source 406 are respectively referred to as "driving sources" as well. Note that the lengths of the arms 12 to 15, 17, and 18 are respectively not particularly limited and can be set as appropriate.

The base 11 and the first arm 12 are coupled via a joint 171. The first arm 12 is capable of turning around a first turning axis O1 parallel to the vertical direction with respect to the base 11 with the first turning axis O1 set as a turning center. The first turning axis O1 coincides with the normal of the upper surface of a floor 101, which is a setting surface of the base 11. The first turning axis O1 is a turning axis present on the most upstream side of the robot 8. The first arm 12 turns according to driving of the first driving source 401 including a motor (a first motor) 401M and a reduction gear (not shown in the figure). The motor 401M is controlled by the robot control device 30 via a motor driver 301. Note that the reduction gear may be omitted.

The first arm 12 and the second arm 13 are coupled via a joint 172. The second arm 13 is capable of turning with respect to the first arm 12 with a second turning axis O2 parallel to the horizontal direction set as a turning center. The second turning axis O2 is orthogonal to the first turning axis O1. The second arm 13 turns according to driving of the second driving source 402 including a motor (a second motor) 402M and a reduction gear (not shown in the figure). The motor 402M is controlled by the robot control device 30 via the motor driver 302. Note that the reduction gear may be omitted. The second turning axis O2 may be parallel to an axis orthogonal to the first turning axis O1.

The second arm 13 and the third arm 14 are coupled via a joint 173. The third arm 14 is capable of turning around a third turning axis O3 parallel to the horizontal direction with respect to the second arm 13 with the third turning axis O3 set as a turning center. The third turning axis O3 is parallel to the second turning axis O2. The third arm 14 turns according to driving of the third driving source 403 including a motor (a third motor) 403M and a reduction gear (not shown in the figure). The motor 403M is controlled by the robot control device 30 via a motor driver 303. Note that the reduction gear may be omitted.

The third arm 14 and the fourth arm 15 are coupled via a joint 174. The fourth arm 15 is capable of turning around a fourth turning axis O4 parallel to the center axis direction of the third arm 14 with respect to the third arm 14 with the fourth turning axis O4 set as a turning center. The fourth turning axis O4 is orthogonal to the third turning axis O3. The fourth arm 15 turns according to driving of the fourth driving source 404 including a motor (a fourth motor) 404M and a reduction gear (not shown in the figure). The motor 404M is controlled by the robot control device 30 via the motor driver 304. Note that the reduction gear may be omitted. The fourth turning axis O4 may be parallel to an axis orthogonal to the third turning axis O3.

The fourth arm 15 and the fifth arm 17 of the wrist 16 are coupled via a joint 175. The fifth arm 17 capable of turning around a fifth turning axis O5 with respect to the fourth arm 15 with the fifth turning axis O5 set as a turning center. The fifth turning axis O5 is orthogonal to the fourth turning axis O4. The fifth arm 17 turns according to driving of the fifth driving source 405 including a motor (a fifth motor) 405M and a reduction gear (not shown in the figure). The motor 405M is controlled by the robot control device 30 via a motor driver 305. Note that the reduction gear may be omitted. The fifth turning axis O5 may be parallel to an axis orthogonal to the fourth turning axis O4.

The fifth arm 17 and the sixth arm 18 of the wrist 16 are coupled via a joint 176. The sixth arm 18 is capable of turning around a sixth turning axis O6 with respect to the fifth arm 17 with the sixth turning axis O6 set as a turning center. The sixth turning axis O6 is orthogonal to the fifth turning axis O5. The sixth arm 18 turns according to driving of the sixth driving source 406 including a motor (a sixth motor) 406M and a reduction gear (not shown in the figure). The motor 406M is controlled by the robot control device 30 via a motor driver 306. Note that the reduction gear may be omitted. The sixth turning axis O6 may be parallel to an axis orthogonal to the fifth turning axis O5.

Note that the wrist 16 includes, as the sixth arm 18, a wrist main body 161 formed in a cylindrical shape and includes, as the fifth arm 17, a supporting ring 162 formed in a ring shape configured separately from the wrist main body 161 and provided in the proximal end portion of the wrist main body 161.

In the driving sources 401 to 406, a first angle sensor 411, a second angle sensor 412, a third angle sensor 413, a fourth angle sensor 414, a fifth angle sensor 415, and a sixth angle sensor 416 are respectively provided in the motors or the reduction gears. The angle sensors are not particularly limited. For example, an encoder such as a rotary encoder can be used. Rotation (turning) angles of rotation axes (turning axes) of the motors or the reduction gears of the driving sources 401 to 406 are respectively detected by the angle sensors 411 to 416.

The motors of the driving sources 401 to 406 are respectively not particularly limited. For example, it is desirable to use a servo motor such as an AC servo motor or a DC servo motor.

The robot 8 is electrically connected to the robot control device 30. That is, the driving sources 401 to 406 and the angle sensors 411 to 416 are respectively electrically connected to the robot control device 30.

The robot control device 30 can actuate the arms 12 to 15 and the wrist 16 independently from one another, that is, control the driving sources 401 to 406 independently from one another via the motor drivers 301 to 306. In this case, the robot control device 30 performs detection with the angle sensors 411 to 416 and controls, on the basis of a result of the detection, driving of the driving sources 401 to 406, for example, angular velocities, rotation angles, and the like, respectively. The control program for the control is stored in the storing section 208 of the robot control device 30 in advance.

In this embodiment, the base 11 is a portion located in the bottom in the vertical direction of the robot and fixed to (set on) the floor 101 or the like of a setting space. A method of the fixing is not particularly limited. For example, in this embodiment, a fixing method by a plurality of bolts 111 is used.

For example, the motor 401M, the motor drivers 301 to 306, and the like are housed in the base 11.

The arms 12 to 15 respectively include hollow arm main bodies 2, driving mechanisms 3 housed in the arm main bodies 2 and including motors, and a sealing member 4 that seals the arm main bodies 2. Note that, in the drawings, the arm main body 2, the driving mechanism 3, and the sealing member 4 included in the first arm 12 are respectively represented as "2a", "3a", and "4a" as well. The arm main body 2, the driving mechanism 3, and the sealing member 4 included in the second arm 13 are respectively represented as "2b", "3b", and "4b" as well. The arm main body 2, the driving mechanism 3, and the sealing member 4 included in the third arm 14 are respectively represented as "2c", "3c", and "4c" as well. The arm main body 2, the driving mechanism 3, and the sealing member 4 included in the fourth arm 15 are respectively represented as "2d", "3d", and "4d" as well.

The simulation device 5 is explained. First, the virtual robot 8A is briefly explained.

As shown in FIG. 11, the virtual robot 8A is the same as the robot 8 in the first embodiment. The virtual robot 8A includes a virtual base 11A and a virtual manipulator 10A (a virtual robot arm). The virtual manipulator 10A includes a plurality of arms provided to be capable of turning, in this embodiment, a virtual first arm 12A, a virtual second arm 13A, a virtual third arm 14A, a virtual fourth arm 15A, a virtual fifth arm 17A, and a virtual sixth arm 18A. The virtual manipulator 10A includes a plurality of driving sources that drive the arms, in this embodiment, sixth driving sources (not shown in the figure).

A virtual wrist 16A is configured by the virtual fifth arm 17A and the virtual sixth arm 18A. A virtual end effector (not shown in the figure) such as a virtual hand can be detachably attached to the distal end of the virtual sixth arm 18A, that is, the distal end of the virtual wrist 16A.

Note that, in the following explanation of the simulation device 5, the virtual end effector is not attached to the virtual sixth arm 18A of the virtual robot 8A.

As shown in FIG. 10, the simulation device 5 includes a control section 51 that performs respective kinds of control, a storing section 52 that stores respective kinds of information, and an operation section 53 that performs respective kinds of operation. The simulation device 5 has a function of performing a simulation of the operation of the virtual robot 8A on a virtual space.

A display device 6 capable of displaying images such as an image indicating the simulation is connected to the simulation device 5. A simulation system is configured by the simulation device 5 and the display device 6. Note that the simulation device 5 may include a display device (a display section) instead of the display device 6. The simulation device 5 may include the display device separately from the display device 6. The simulation performed by the simulation device 5 is explained below.

As shown in FIGS. 11 and 12, in the simulation of the simulation device 5, a first region 71 and a second region 72 located on the inside of the first region 71 can be set on the virtual space. Note that, in the virtual space, a world coordinate system (a global coordinate system) is set. When the virtual robot 8A operates, as shown in FIG. 11, when a specific portion of the virtual robot 8A intrudes into the first region 71, the operating speed of the virtual robot 8A is limited. As shown in FIG. 12, when the specific portion of the virtual robot 8A intrudes into the second region 72, the operation of the virtual robot 8A stops or the virtual robot 8A retracts from the second region 72. This simulation is displayed on the display device 6.

The first region 71 and the second region 72 can be respectively optionally set on the virtual space. The first region 71 and the second region 72 are set to surround a predetermined object 81 on the virtual space, for example, the object 81 with which the virtual robot 8A is desired to not be caused to collide with. Examples of the object 81 include a peripheral device. Consequently, it is possible to suppress the virtual robot 8A from colliding with the object 81 with which the virtual robot 8A is desired to not be caused to collide with such as the peripheral device. Consequently, it is possible to easily perform the simulation. It is possible to easily perform, for example, offline teaching concerning the real robot 8.

The first region 71 and the second region 72 can be respectively set on the basis of the world coordinate system. However, the first region 71 and the second region can also be set on the basis of a coordinate system different from the world coordinate system. In this embodiment, the setting of the first region 71 and the second region 72 is performed on the basis of a coordinate system different from the world coordinate system. Examples of the coordinate system different from the world coordinate system include a local coordinate system (a user coordinate system). Consequently, it is possible to set coordinate axes in any directions. Therefore, convenience is high.

The first region 71 and the second region 72 are respectively three-dimensional regions. The shapes of the first region 71 and the second region 72 are respectively not particularly limited and can be set as appropriate according to various conditions. In this embodiment, the shapes are rectangular parallelepipeds. Cubes are included in the rectangular parallelepipeds. Note that the shapes of the first region 71 and the second region 72 may be respectively shapes like margins in another embodiment explained below, that is, shapes along the external shapes of predetermined target objects.

The shape of the first region 71 and the shape of the second region 72 may be identical, that is, similar or may be different.

The specific portion of the virtual robot 8A can be optionally set. In this embodiment, the specific portion is set in "any portion of the virtual robot 8A". Therefore, in this embodiment, when any portion of the virtual robot 8A intrudes into the first region 71, the operating speed of the virtual robot 8A is limited. When any portion of the virtual robot 8A intrudes into the second region 72, the operation of the virtual robot 8A stops or the virtual robot 8A retracts from the second region 72.

Other specific examples of the specific portion include the distal end of the virtual manipulator 10A and a portion a predetermined distance apart from the distal end of the virtual manipulator 10A in the proximal end direction.

In this case, in the virtual robot 8A in a state in which a virtual end effector is not attached to the virtual sixth arm 18A, the distal end of the virtual sixth arm 18A is the distal end of the virtual manipulator 10A.

In the virtual robot 8A in a state in which a virtual end effector is attached to the virtual sixth arm 18A, the distal end of the virtual end effector may be set as the distal end of the virtual manipulator 10A or the distal end of the virtual sixth arm 18A may be set as the distal end of the virtual manipulator 10A. That is, as the distal end of the virtual manipulator 10A, one of the distal end of the virtual end effector and the distal end of the virtual sixth arm 18A can be selected.

Specific examples of the limitation of the operating speed of the virtual robot 8A include (1) and (2) described below.

(1) The operating speed is set lower than the operating speed before the intrusion into the first region 71. Specifically, the moving speed of the distal end portion of the virtual manipulator 10A is set lower than the moving speed before the intrusion into the first region 71.

(2) An upper limit value of the operating speed is set smaller than the upper limit value before the intrusion into the first region 71. Specifically, an upper limit value of the moving speed of the distal end portion of the virtual manipulator 10A is set smaller than the upper limit value before the intrusion into the first region 71.

When the virtual robot 8A retracts from the second region 72, a position to which the virtual robot 8A retracts is not particularly limited and can be set as appropriate according to various conditions. However, the virtual robot 8A desirably retracts to the outer side of the first region 71. Note that examples of the position to which the virtual robot 8A retracts include an initial position.

The simulation result of the simulation device 5 is stored in the storing section 208 of the robot control device 30.

Information concerning the simulation result is used for control of the real robot 8 by the robot control device 30.

As another configuration example, information concerning the first region 71 and the second region 72 is stored in the storing section 208 of the robot control device 30. That is, in the robot control device 30, the first region 71 and the second region 72 are defined.

Information concerning the defined first region 71 and the defined second region 72 is used for the control of the real robot 8 by the robot control device 30. That is, the robot control device 30 controls the robot 8 on the basis of the information concerning the first region 71 and the second region 72.

The control of the robot 8 is the same as the simulation. To put it briefly, when a specific portion of the robot 8 intrudes into the first region 71, the operating speed of the robot 8 is limited and, when the specific portion of the robot 8 intrudes into the second region 72, the operation of the robot 8 stops or the robot 8 retracts from the second region 72. Note that this control may be performed by connecting the simulation device 5 to the robot control device 30.

An example of control operation of the robot 8 by the robot control device 30 is explained. Note that, in the following explanation of the control operation, the specific portion of the robot 8 is set in "any portion of the robot 8". When any portion of the robot 8 intrudes into the first region 71, the operating speed of the robot 8 is set lower than the operating speed before the intrusion. When any portion of the robot 8 intrudes into the second region 72, the operation of the robot 8 stops.

As shown in FIG. 13, in the control of the robot 8, first, the robot control device 30 determines whether the robot 8 has instructed into the first region 71 (step S401). When determining that any portion of the robot 8 intrudes into the first region 71, the robot control device determines that the robot 8 "has intruded". When determining that no portion of the robot 8 has intruded into the first region 71, the robot control device 30 determines that the robot 8 "has not intruded".

When determining in step S401 that the robot 8 has intruded into the first region 71, the robot control device 30 sets the operating speed of the robot 8 lower than the operating speed before the intrusion into the first region (step S402) and proceeds to step S403. By setting the operating speed of the robot 8 to low speed, when the robot intrudes into the second region 72, it is possible to quickly stop the operation of the robot 8.

When determining in step S401 that the robot 8 has not intruded into the first region 71, the robot control device 30 returns to step S401 and executes step S401 and subsequent steps again.

Subsequently, in step S403, the robot control device 30 determines whether the entire robot 8 has moved out of the first region 71 (step S403).

When determining in step S403 that the entire robot 8 has moved out of the first region 71, the robot control device 30 returns the operating speed of the robot 8 to original speed, that is, speed before the intrusion into the first region 71 (step S404). The robot control device 30 returns to step S401 and executes step S401 and subsequent steps again.

When determining in step S403 that at least a part of the robot 8 has not moved out of the first region 71, that is, the robot 8 intrudes into the first region 71, the robot control device 30 determines whether the robot 8 has intruded into the second region 72 (step S405). When determining that any portion of the robot 8 has intruded into the second region 72, the robot control device 30 determines that the robot 8 "has intruded". When determining that no portion of the robot 8 has intruded into the second region 72, the robot control device 30 determines that the robot "has not intruded".

When determining in step S405 that the robot 8 has intruded into the second region 72, the robot control device stops the operation of the robot 8 (step S406). Consequently, it is possible to suppress the robot 8 from colliding with an object with which the robot 8 is desired not to be caused to collide with such as a real peripheral device.

When determining in step S405 that the robot 8 has not intruded into the second region 72, the robot control device 30 returns to step S403 and executes step S403 and subsequent step S403 again.

As explained above, in the simulation device 5, in the simulation of the operation of the virtual robot 8A on the virtual space, it is possible to suppress the virtual robot 8A from colliding with the object 81 with which the virtual robot 8A is desired not to be caused to collide such as a virtual peripheral device.

The simulation result of the simulation device 5 is used in the control of the robot 8. That is, the robot control device 30 controls the robot 8 on the basis of the simulation result. Consequently, it is possible to operate the robot 8 without causing the robot 8 to collide with an object with which the robot 8 is desired not to be caused to collide such as a real peripheral device. In this way, it is possible to easily provide a safe and high-performance robot control device 30.

Note that, in this embodiment, double regions of the first region 71 and the second region 72 can be set. However, in the invention, triple or more regions can be set. When the triple or more regions are set, for example, the operating speed is limited stepwise.

Third Embodiment

Figure 14:
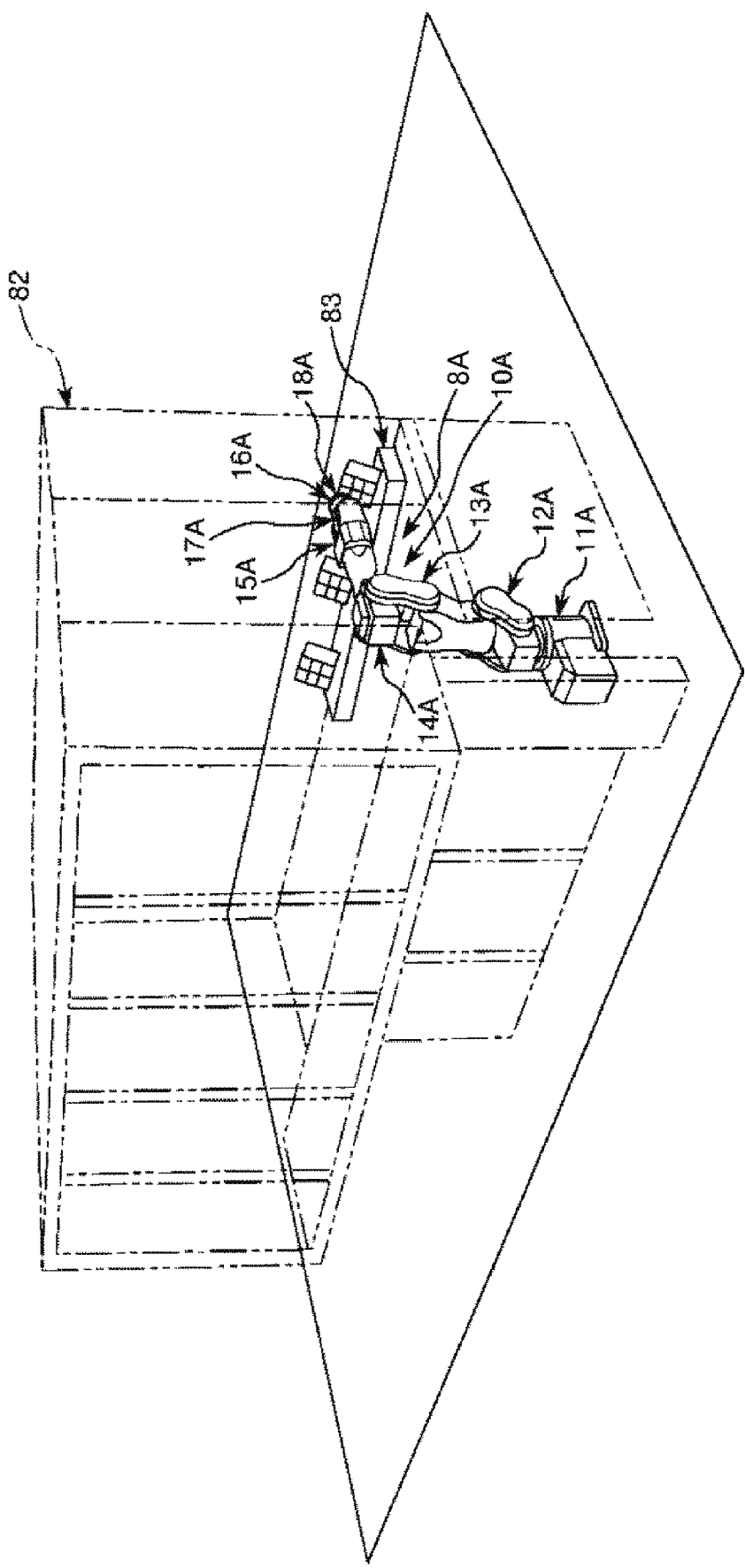
FIG. 14 is a diagram for explaining a simulation of a simulation device according to a third embodiment.

FIG. 14 is a diagram for explaining a simulation of a simulation device according to a third embodiment. Note that, in FIG. 14, the inside of a cell is shown in a simplified manner.

This embodiment is explained below. However, differences from the embodiments explained above are mainly explained. Explanation of similarities is omitted.

The robot control device 30 in this embodiment controls the robot 8 on the basis of a simulation result of a simulation performed by the simulation device 5 in this embodiment explained below.

As shown in FIG. 14, in the simulation of the simulation device 5 in this embodiment, it is possible to semi-transparently display a cell 82, which is an example of a predetermined object on a virtual space.

The "semi-transparently" does not mean that transparency is a half of complete transparency but means transparency that enables visual recognition of the inside of a target object. Complete transparency that disables visual recognition of the target object itself is excluded.

Consequently, for example, when CAD data or the like is captured into the simulation device 5, it is possible to easily visually recognize the inside of the cell 82 or an object 83 such as a workbench or a work target object disposed on the inside of the cell 82 without performing operation for, for example, removing the cell 82 on the virtual space. Consequently, it is possible to easily perform a simulation. It is possible to easily perform, for example, offline teaching concerning the real robot 8, check of a moving route of the virtual robot 8A, check of collision of the virtual robot 8A.

In the simulation, it is possible to set the transparency of the semi-transparently displayed cell 82. Consequently, it is possible to adjust a balance of visibility of a contour of the cell 82 and visibility of the inside of the cell 82. It is possible to easily perform the simulation.

The simulation device 5 is configured to be capable of selecting a first display mode for enabling the semitransparent display and a second display mode for disabling the semitransparent display. Consequently, when it is not desired to intentionally semi-transparently display the cell 82, it is possible to not semi-transparently display the cell 82 by selecting the second display mode.

According to this embodiment explained above, it is possible to exhibit an effect same as the effect in the embodiments explained above.

Note that, in this embodiment, as an example, the cell 82 is semi-transparently displayed. However, the invention is not limited to this. The simulation device 5 may be configured to be capable of semi-transparently displaying any object among a plurality of objects other than the virtual object 8A on the virtual space. When focusing on predetermined one object, the simulation device 5 may be configured to be capable of semi-transparently displaying only any portion of the object. The simulation device 5 may be configured to be capable of semi-transparently displaying a robot as well. The simulation device 5 may be configured to be capable of semi-transparently displaying only any portion of the robot.

This can be realized by, for example, configuring the simulation device 5 to be capable of performing the selection of the first display mode and the second display mode and the setting of the transparency in units in capturing the CAD data or the like into the simulation device 5.

Fourth Embodiment

Figure 15:
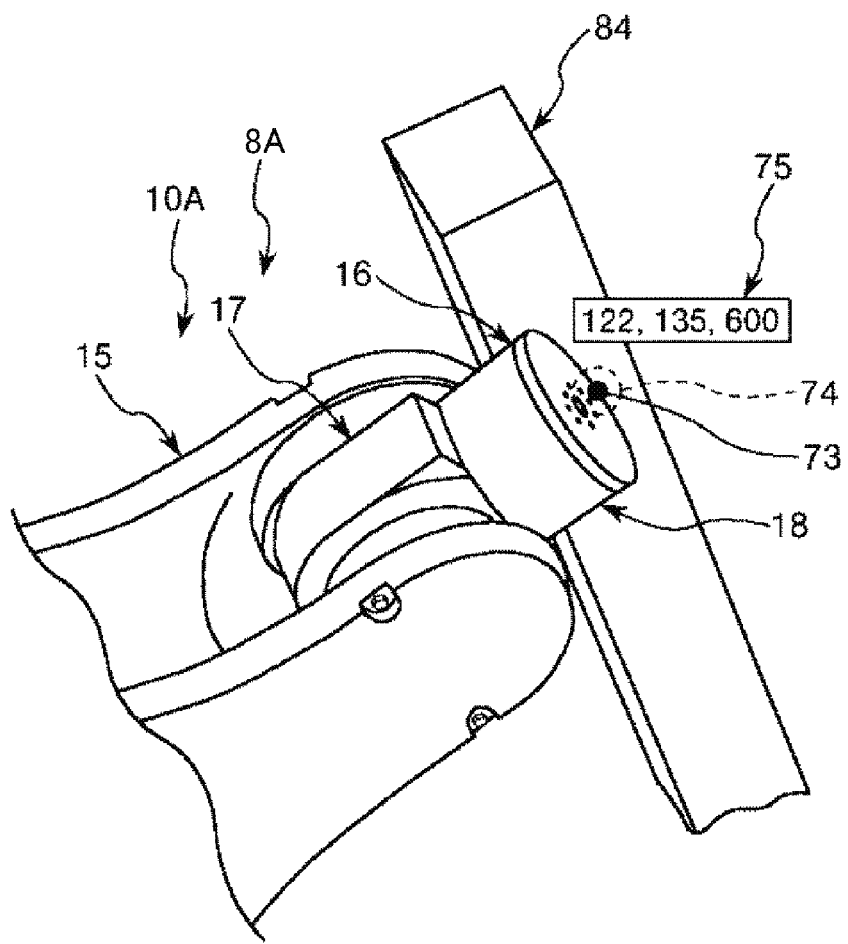
FIG. 15 is a diagram for explaining a simulation of a simulation device according to a fourth embodiment.

FIG. 15 is a diagram for explaining a simulation of a simulation device according to a fourth embodiment.

This embodiment is explained below. However, differences from the embodiments explained above are mainly explained. Explanation of similarities is omitted.

The robot control device 30 in this embodiment controls the robot 8 on the basis of a simulation result of a simulation performed by the simulation device 5 in this embodiment explained below.

As shown in FIG. 15, in the simulation of the simulation device 5 in this embodiment, when a predetermined object 84 on a virtual space and the virtual robot 8A come into contact with each other, a first mark 73 different from the object 84 and the virtual robot 8A is displayed in a contact portion of the object 84 and the virtual robot 8A.

Consequently, it is possible to easily grasp the contact portion of the object 84 and the virtual robot 8A. Consequently, it is possible to easily perform the simulation. It is possible to easily perform, for example, offline teaching concerning the real robot 8 and setting of a moving route of the virtual robot 8A, disposition of a virtual peripheral device, and the like.

The shape of the first mark 73 is not particularly limited and can be set as appropriate according to various conditions. In this embodiment, the shape of the first mark 73 is a sphere. The dimension of the first mark 73 is not particularly limited and can be set as appropriate according to various conditions. Note that, in this embodiment, the first mark 73 is formed by a small sphere.

When the object 84 and the virtual robot 8A come into contact with each other, a semitransparent second mark 74 surrounding the first mark 73 is displayed.

Consequently, it is possible to more easily grasp the contact portion of the object 84 and the virtual robot 8A.

The shape of the second mark 74 is not particularly limited and can be set as appropriate according to various conditions. In this embodiment, the shape is a sphere. The dimension of the second mark 74 is not particularly limited and can be set as appropriate according to various conditions. Note that, in this embodiment, the second mark 74 is formed by a small sphere having a radius larger than the radius of the first mark 73. The center of the first mark 73 and the center of the second mark 74 are disposed to coincide with each other.

Colors of the first mark 73 and the second mark 74 are respectively not particularly limited and can be set as appropriate according to various conditions. However, the color of the first mark 73 and the color of the second mark 74 are desirably different. Consequently, it is possible to easily visually recognize the first mark 73.

When the object 84 and the virtual robot 8A come into contact with each other, a coordinate of the contact portion of the object 84 and the virtual robot 8A is displayed. In this embodiment, an X coordinate, a Y coordinate, and a Z coordinate of the contact portion are displayed in a frame 75. Note that in an example shown in the figure, a coordinate (122, 135, 600) is displayed in the frame 75.

Consequently, it is possible to quantitatively, easily, and accurately grasp the position of the contact portion of the object 84 and the virtual robot 8A.

When the object 84 and the virtual robot 8A come into contact with each other, at least one of colors of the object 84 and the virtual robot 8A, desirably, both the colors are changed to a color different from the colors before the contact, for example, red. In this case, the colors of the first mark 73 and the second mark 74 are respectively set to colors different from the color after the contact, that is, red. As the colors, predetermined colors can be respectively selected out of a plurality of colors.

Consequently, it is possible to easily grasp that the object 84 and the virtual robot 8A come into contact with each other.

According to this embodiment explained above, it is possible to exhibit an effect same as the effect in the embodiments explained above.

Fifth Embodiment

Figure 16:
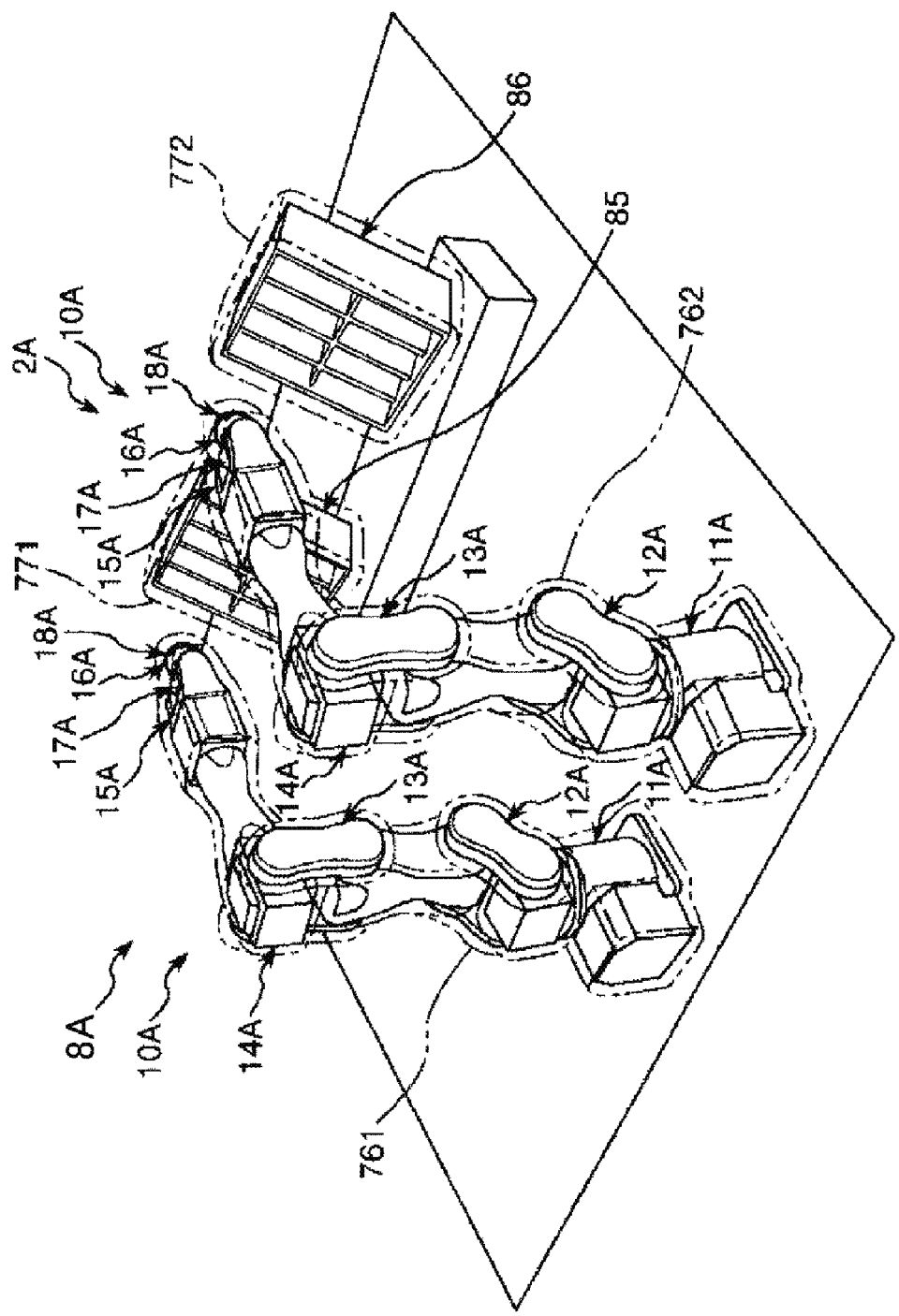
FIG. 16 is a diagram for explaining a simulation of a simulation device according to a fifth embodiment.
Figure 17:
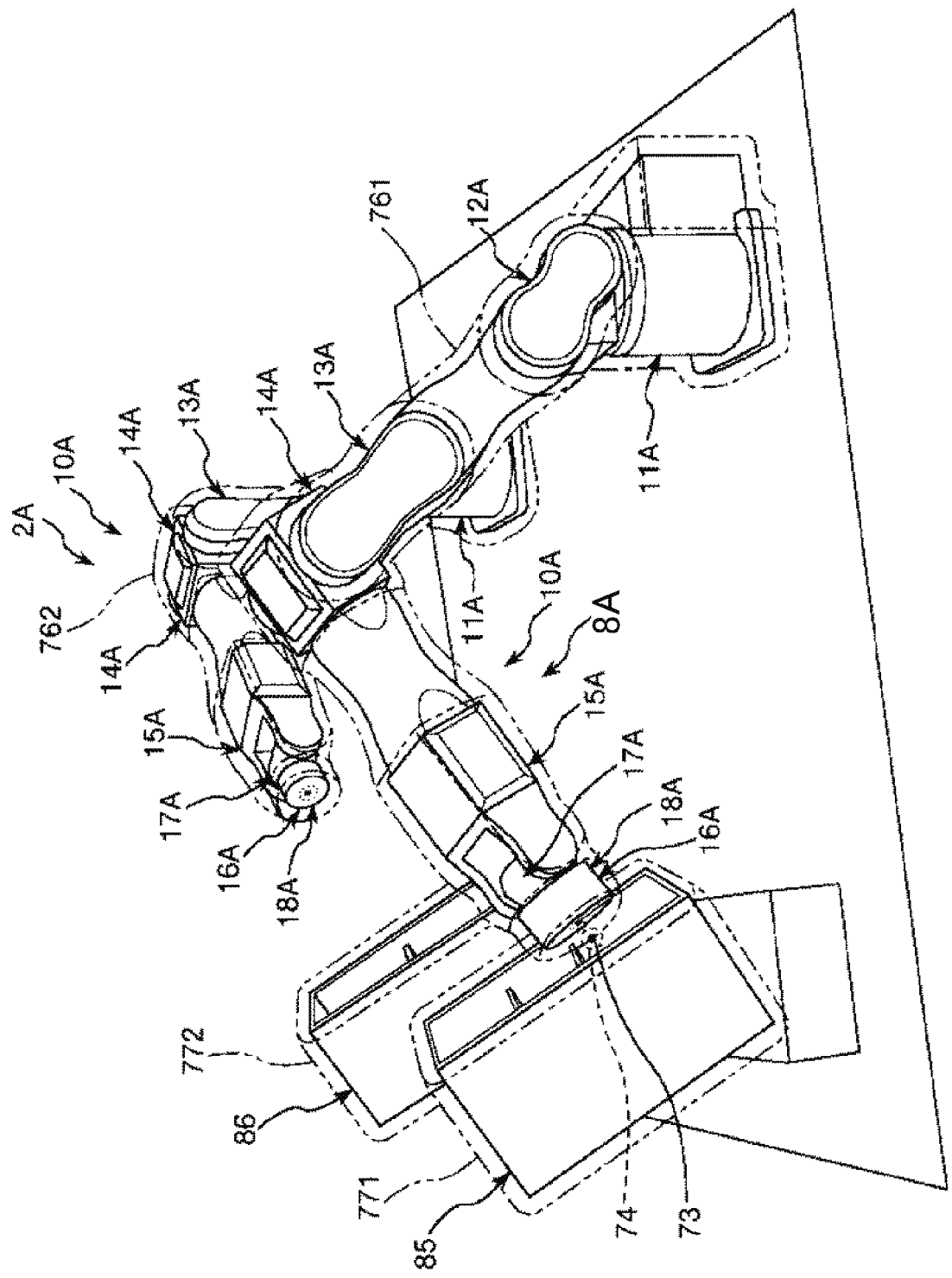
FIG. 17 is a diagram for explaining the simulation of the simulation device according to the fifth embodiment.

FIGS. 16 and 17 are respectively diagrams for explaining a simulation of a simulation device according to a fifth embodiment.

This embodiment is explained below. However, differences from the embodiments explained above are mainly explained. Explanation of similarities is omitted.

The robot control device 30 in this embodiment controls the robot 8 on the basis of a simulation result of a simulation performed by the simulation device 5 in this embodiment explained below.

As shown in FIGS. 16 and 17, in the simulation of the simulation device 5 in this embodiment, a margin 761 can be set in the virtual robot 8A on the basis of the shape of the virtual robot 8A. A margin 762 can be set in the virtual robot 2A on the basis of the shape of the virtual robot 2A. Similarly, a margin 771 can be set in a predetermined object 85 on a virtual space on the basis of the shape of the object 85. A margin 772 can be set in a predetermined object 86 on the virtual space on the basis of the shape of the object 86. The margin 761 is set in predetermined thickness along the external shape of the virtual robot 8A. The margin 762 is set in predetermined thickness along the external shape of the virtual robot 2A. Similarly, the margin 771 is set in predetermined thickness along the external shape of the object 85. The margin 772 is set in predetermined thickness along the external shape of the object 86. Note that the objects 85 and 86 are respectively object with which the virtual robots 8A and 2A are desired to not be caused to collide.

The thicknesses of the margins 761, 762, 771, and 772 are respectively not particularly limited and can be set as appropriate according to various conditions. The thicknesses of the margins 761, 762, 771, and 772 may be the same as each other or may be different from each other.

The thickness of the margin 761 may be fixed or may be different depending on a part. The same applies to the thicknesses of the margins 762, 771, and 772.

When focusing on the virtual robot 8A, the margin 761 set in the virtual robot 8A is a first margin. The other three margins 762, 771, and 772 are respectively second margins. In this case, the virtual robot 2A is defined as the predetermined object on the virtual space.

Similarly, when focusing on the virtual robot 2A, the margin 762 set in the virtual robot 2A is the first margin. The other three margins 761, 771, and 772 are the second margins. In this case, the virtual robot 8A is defined as the predetermined object on the virtual space.

That is, in a relation between the virtual robot 8A and the virtual robot 2A, one of the virtual robot 8A and the virtual robot 2A is the virtual robot defined in the appended claims and the other is the predetermined object on the virtual space.

When the virtual robot 8A operates, as shown in FIG. 17, if the margin 761 and any one of the other three margins 762, 771, and 772 come into contact with each other, the operating speed of the virtual robot 8A is limited, the operation of the virtual robot 8A stops, or the virtual robot 8A retracts in a direction in which the margin 761 separates from the other margin with which the margin 761 is in contact. Note that, in FIG. 17, an example is shown in which the margin 761 and the margin 771 are in contact.

Consequently, it is possible to suppress the virtual robot 8A from colliding with the objects 85 and 86 and the virtual robot 2A.

Similarly, when the virtual object 2A operates, if the margin 762 and any one of the other three margins 761, 771, and 772 come into contact with each other, the operating speed of the virtual robot 2A is limited, the operation of the virtual robot 2A stops, or the virtual robot 2A retracts in a direction in which the margin 762 separates from the other margin with which the margin 762 is in contact.

Consequently, it is possible to suppress the virtual robot 2A from colliding with the objects 85 and 86 and the virtual robot 8A.

Therefore, it is possible to easily perform the simulation. It is possible to easily perform, for example, offline teaching concerning the real robot 8.

Specific examples of the limitation of the operating speed of the virtual robot 8A and 2A include (1) and (2) described below.

(1) The operating speed is set lower than the operating speed before the contact of the margins. Specifically, the moving speed of the distal end portion of the virtual manipulator 10A is set lower than the moving speed before the contact of the margins.

(2) An upper limit value of the operating speed is set smaller than the upper limit value before the contact of the margins. Specifically, an upper limit value of the moving speed of the distal end portion of the virtual manipulator 10A is set smaller than the upper limit value before the contact of the margins.

In the simulation, the thicknesses of the margins 761, 762, 771, and 772 can be respectively changed.

Consequently, it is possible to more surely suppress the virtual robot 8A from colliding with the objects 85 and 86 and the virtual robot 2A and more surely suppress the virtual robot 2A from colliding with the objects 85 and 86 and the virtual robot 8A. It is possible to prevent the thicknesses of the margins 761, 762, 771, and 772 from becoming excessively large to hinder work of the virtual robots 8A and 2A.

According to this embodiment explained above, it is possible to exhibit an effect same as the effect of the embodiments explained above.

Note that, when focusing on the virtual robot 8A and the object 85 on the virtual space, in this embodiment, it is possible to set margins respectively in the virtual robot 8A and the object 85. However, the invention is not limited to this. A margin may be able to be set only in the virtual robot 8A. A margin may be able to be set only in the object 85.

Similarly, when focusing on the virtual robot 8A and the virtual robot 2A, in this embodiment, margins can be respectively set in the virtual robots 8A and 2A. However, the invention is not limited to this. A margin may be able to be set only in the virtual robot 8A. A margin may be able to be set only in the virtual robot 2A.

In this embodiment, the virtual robots are configured to perform the predetermined operation while being triggered by the contact of the margins. However, when a margin is set in only one of the virtual robots, the virtual robots are configured to perform the predetermined operation while being triggered by the contact of the margin and the other virtual robot or an object as a trigger.

Sixth Embodiment

Figure 18:
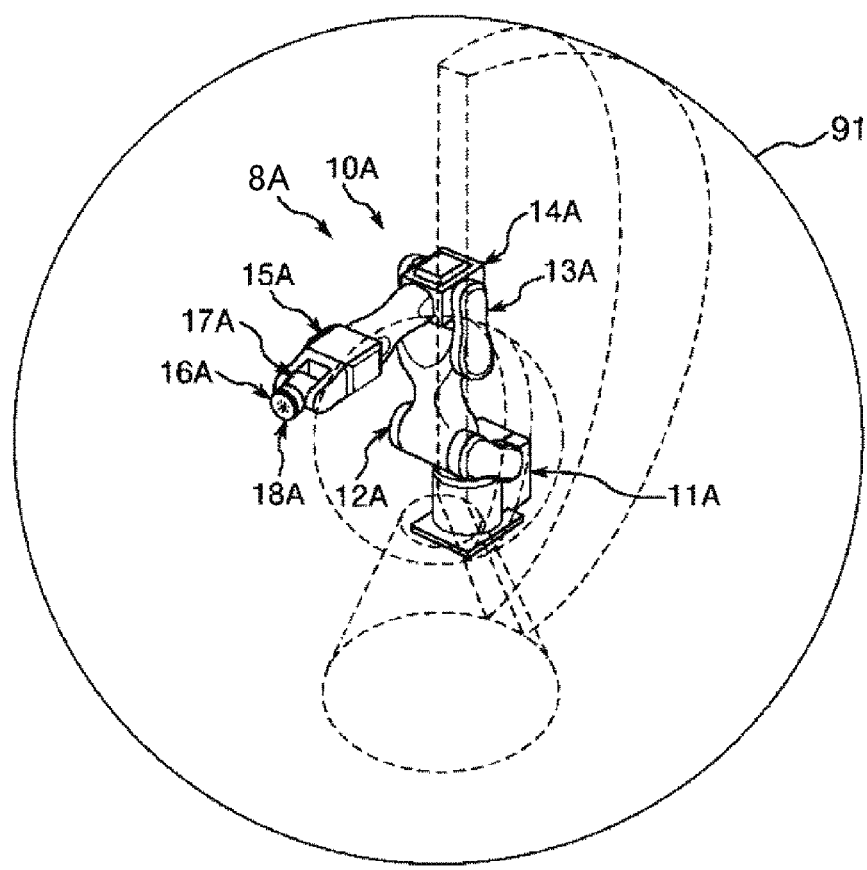
FIG. 18 is a diagram for explaining a simulation of a simulation device according to a sixth embodiment.
Figure 19:
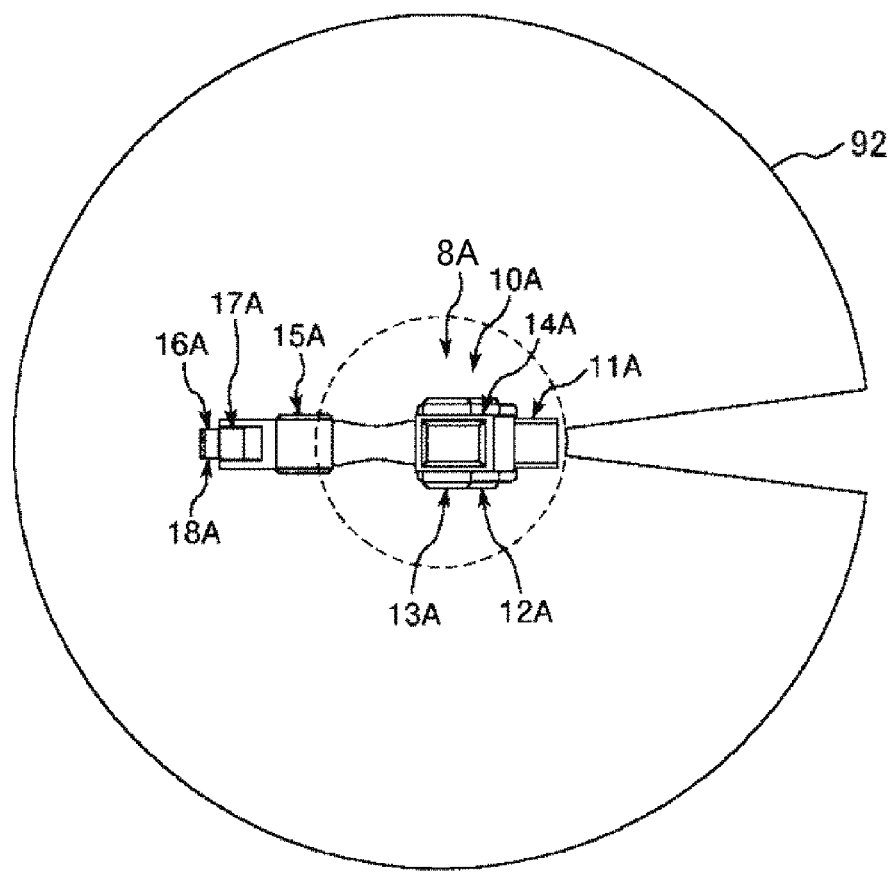
FIG. 19 is a diagram for explaining the simulation of the simulation device according to the sixth embodiment.
Figure 20:
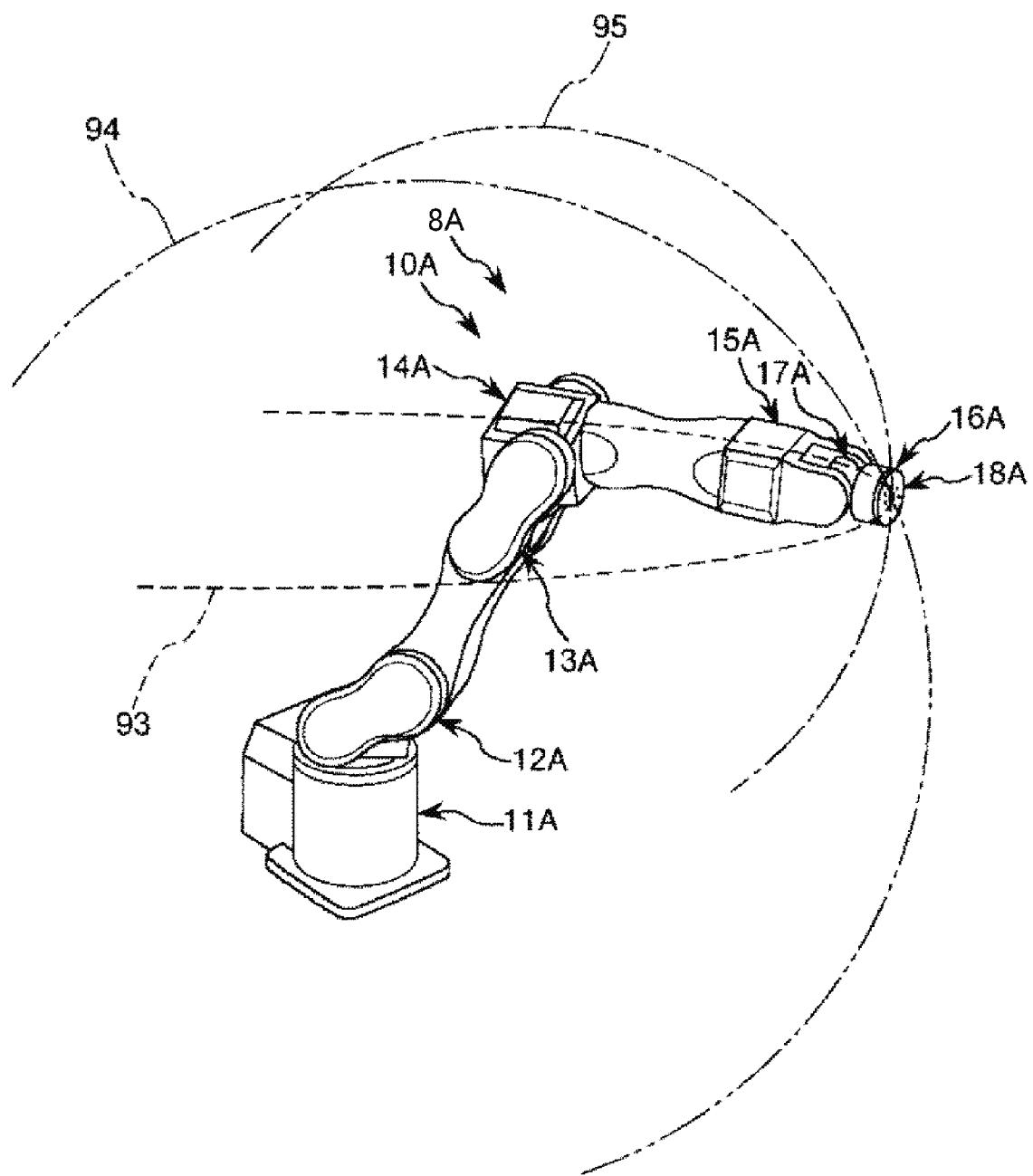
FIG. 20 is a diagram for explaining the simulation of the simulation device according to the sixth embodiment.

FIGS. 18 to 20 are diagrams for explaining a simulation of a simulation device according to a sixth embodiment.

This embodiment is explained below. However, differences from the embodiments explained above are mainly explained. Explanation of similarities is omitted.

The robot control device 30 in this embodiment controls the robot 8 on the basis of a simulation result of a simulation performed by the simulation device 5 in this embodiment explained below.

As shown in FIGS. 18 and 19, in the simulation of the simulation device 5 in this embodiment, it is possible to display a movable range of a specific portion of the virtual manipulator 10A of the virtual robot 8A, that is, a range in which the specific portion of the virtual manipulator 10A is movable.

The specific portion of the virtual manipulator 10A can be optionally set. In this embodiment, the specific portion is "the distal end of the virtual manipulator 10A".

In this embodiment, the movable range of the distal end of the virtual manipulator 10A is indicated by a line segment 91 in a perspective view as shown in FIG. 18 and indicated by a line segment 92 in a plan view as shown in FIG. 19. In the perspective view shown in FIG. 18, a region surrounded by the line segment 91 is the movable range of the distal end of the virtual manipulator 10A. In this case, a region indicated by a dotted line is a non-movable range. In the plan view shown in FIG. 19, a region surrounded by the line segment 92 is the movable range of the distal end of the virtual manipulator 10A. In this case, a region indicated by a dotted line is a non-movable range.

Consequently, it is possible to easily grasp the movable range of the specific portion of the virtual manipulator 10A, that is, the distal end of the virtual manipulator 10A. Therefore, it is possible to easily perform the simulation. It is possible to easily perform, for example, offline teaching concerning the real robot 8 and setting of disposition of a virtual peripheral device and the like.

Note that, as in this embodiment, in the virtual robot 8A in a state in which a virtual end effector is not attached to the virtual sixth arm 18A, the distal end of the virtual sixth arm 18A is the distal end of the virtual manipulator 10A.

In the virtual robot 8A in a state in which a virtual end effector is attached to the virtual sixth arm 18A, the distal end of the virtual end effector may be set as the distal end of the virtual manipulator 10A. The distal end of the virtual sixth arm 18A may be set as the distal end of the virtual manipulator 10A. That is, it is possible to select one of the distal end of the virtual end effector and the distal end of the virtual sixth arm 18A as the distal end of the virtual manipulator 10A.

Note that other specific examples of the specific portion include a portion a predetermined distance apart from the distal end of the virtual manipulator 10A in the proximal end direction.

The movable range of the distal end of the virtual manipulator 10A may be displayed not only in the perspective view and the plan view but also in, for example, a side view, a front view, a rear view, a bottom view, and the like, and the perspective view may be configured such that the point of sight can be changed.

The movable range may be able to be semi-transparently displayed. Transparency of the movable range may be able to be set.

In the simulation, for each of the virtual arms, it is possible to display a movable range of the specific portion of the virtual manipulator 10A, that is, the distal end of the virtual manipulator 10A at the time when the virtual arm is turned.

In this embodiment, in any posture of the virtual robot 8A, it is possible to display a movable range of the distal end of the virtual manipulator 10A at the time when only the virtual first arm 12A is turned, a movable range of the distal end of the virtual manipulator 10A at the time when only the virtual second arm 13A is turned, and a movable range of the distal end of the virtual manipulator 10A at the time when only the virtual third arm 14A is turned.

As shown in FIG. 20, the movable range of the distal end of the virtual manipulator 10A at the time when only the virtual first arm 12A is turned is indicated by a line segment 93 in a perspective view. The movable range of the distal end of the virtual manipulator 10A at the time when only the virtual second arm 13A is turned is indicated by a line segment 94 in the perspective view. The movable range of the distal end of the virtual manipulator 10A at the time when only the virtual third arm 14A is turned is indicated by a line segment 95 in the perspective view. Note that, in FIG. 20, all of the three line segments 93 94, and 95 are shown. The line segments 93, 94, and 95 are individually shown one by one. In FIG. 20, the line segments 93, 94, 95 are shown as different lines to make it easy to distinguish the line segments from one another.

Consequently, it is possible to easily grasp the movable ranges of the distal end of the virtual manipulator 10A respectively at the time when only the virtual first arm 12A is turned, at the time when only the virtual second arm 13A is turned, and at the time when only the virtual third arm 14A is turned. Therefore, it is possible to easily perform the simulation. It is possible to easily perform, for example, offline teaching concerning the real robot 8 and setting of disposition of a virtual peripheral device and the like.

Note that the line segments 93, 94 and 95 may be simultaneously displayed in one image.

With this embodiment explained above, it is possible to exhibit an effect same as the effect in the embodiments explained above.

The robot control device, the robot, and the simulation device according to the invention are explained above on the basis of the embodiments shown in the figures. However, the invention is not limited to this. The components of the sections can be substituted with any components having the same functions. Any other components may be added.

The invention may be a combination of any two or more configurations (characteristics) in the embodiments.

In the embodiments, the fixing part of the base of the robot is, for example, the floor in the setting space. However, the invention is not limited to this. Besides, examples of the fixing part include a ceiling, a wall, a workbench, and a ground.

In the invention, the robot may be set in the cell. In this case, examples of the fixing part of the base of the robot include a floor section, a ceiling section, and a wall section of the cell and a workbench.

In the embodiments, a first surface, which is a plane (a surface) on which the robot (the base) is fixed, is a plane (a surface) parallel to the horizontal surface. However, the invention is not limited to this. The first surface may be, for example, a plane (a surface) inclined with respect to the horizontal surface and the vertical surface or may be a plane (a surface) parallel to the vertical surface. That is, the first turning axis may be inclined with respect to the vertical direction and the horizontal direction or may be parallel to the horizontal direction.

In the embodiments, the number of turning axes of the manipulator is six. However, the invention is not limited to this. The number of turning axes of the manipulator may be, for example, two, three, four, five, or seven or more. In the embodiment, the number of arms (links) is six. However, the invention is not limited to this. The number of arms may be, for example, two, three, four, five, or seven or more. In this case, for example, it is possible to realize a robot including seven arms by adding an arm between the second arm and the third arm in the robot in the embodiments.

In the embodiments, the number of manipulators is one. However, the invention is not limited to this. The number of manipulators may be, for example, two or more. That is, the robot (a robot main body) may be a plural-arm robot such as a double-arm robot.

In the invention, the robot may be a robot of another type. Specific examples of the robot include a horizontal multi-joint robot such as a legged walking (traveling) robot including leg sections and a SCARA robot.

In the embodiments, the robot control device and the simulation device are the separate devices. However, the invention is not limited to this. For example, the robot control device may have the functions of the simulation device.

What is claimed is:

1. A system for controlling an industrial robot, comprising:
   a simulation processor configured to (i) perform a simulation of movement of a virtual robot performing an operation in a virtual space, wherein the virtual robot is not a real robot, and (ii) generate and store a simulation result based on the simulation, wherein the simulation result includes information indicating an operation program used to control the virtual robot during the simulation; and
   a controller configured to, subsequent to storing the simulation result indicating the operation program used to control the virtual robot during the simulation, control actual movement of the industrial robot based on the simulation result previously stored and generated using the virtual robot,
   wherein, to generate the simulation result, the simulation processor is configured to:
      define, in the virtual space, a first region and a second region, wherein the second region is located inside of the first region, wherein the second region surrounds a predetermined object within the virtual space, and wherein the first region surrounds the second region,
      control movement of the virtual robot within the virtual space,
      in response to a determination that a predetermined portion of the virtual robot has intruded from a region outside of the first region into the first region, lower an operating speed of the virtual robot to suppress movement of the virtual robot further into the first region, and
      in response to a determination that the predetermined portion of the virtual robot has intruded into the second region, stop the movement of the virtual robot or retract the virtual robot from the second region to prevent collision of the virtual robot with the predetermined object in the second region.

2. The system according to claim 1 further comprising:
   a memory configured to store the simulation result.

3. A simulation method for controlling movement of a virtual robot in a virtual space, wherein the virtual robot is not a real robot, the simulation method comprising:
   using a processor, generating and storing a simulation result that includes information indicating an operation program used to control the virtual robot during the simulation method, generating and storing the simulation result further comprising
a first determining step which determines whether a predetermined portion of the virtual robot has intruded into a first region, wherein the first region surrounds a second region, and wherein the second region surrounds a predetermined object within the virtual space,
a first setting step which sets an operating speed of the virtual robot lower than the operating speed before the intrusion into the first region to suppress movement of the virtual robot further into the first region when the first determining step determines that the predetermined portion has intruded into the first region from a region outside the first region,
a second determining step which determines whether the predetermined portion has intruded into the second region located inside of the first region, and
a stopping step which stops the virtual robot when the second determining step determines that the predetermined portion has intruded into the second region to prevent collision of the virtual robot with the predetermined object in the second region; and
subsequent to storing the simulation result, controlling actual movement of an industrial robot based on the simulation result previously stored and generated using the virtual robot.

4. The simulation method according to claim 3 further comprising, using the processor:
a second setting step which sets the operating speed to the operating speed before the intrusion into the first region when the predetermined portion has moved out of the first region.

5. A controlling method for controlling the industrial robot, the controlling method including the simulation method of claim 3 and further comprising:
a controlling step which controls actual movement of the industrial robot based on the simulation result generated using the virtual robot acquired in the simulation method.

* * * * *